US012300328B2

United States Patent
Saito et al.

(10) Patent No.: US 12,300,328 B2
(45) Date of Patent: May 13, 2025

(54) MEMORY SYSTEM AND METHOD FOR CONTROLLING SEMICONDUCTOR MEMORY

(71) Applicant: Kioxia Corporation, Tokyo (JP)

(72) Inventors: Masahiro Saito, Tokyo (JP); Kiwamu Watanabe, Kawasaki Kanagawa (JP); Yuko Noda, Kawasaki Kanagawa (JP); Tsukasa Tokutomi, Kamakura Kanagawa (JP); Yoshiki Takai, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 265 days.

(21) Appl. No.: 18/177,877

(22) Filed: Mar. 3, 2023

(65) Prior Publication Data

US 2023/0402106 A1  Dec. 14, 2023

(30) Foreign Application Priority Data

Jun. 10, 2022 (JP) .................................. 2022-094575

(51) Int. Cl.
*G11C 7/00* (2006.01)
*G11C 11/56* (2006.01)
*G11C 16/04* (2006.01)
*G11C 16/10* (2006.01)
*G11C 16/26* (2006.01)

(52) U.S. Cl.
CPC .......... *G11C 16/26* (2013.01); *G11C 11/5642* (2013.01); *G11C 16/0483* (2013.01); *G11C 16/10* (2013.01)

(58) Field of Classification Search
CPC ....... G11C 7/1051; G11C 7/22; G11C 7/1072; G11C 7/1006; G11C 7/1066
USPC ........................................ 365/189.14, 189.15
See application file for complete search history.

(56) References Cited

U.S. PATENT DOCUMENTS

| 9,251,892 | B1 * | 2/2016 | Asami ................. G11C 11/5642 |
| 10,325,664 | B2 | 6/2019 | Tokutomi et al. |
| 10,490,285 | B2 | 11/2019 | Yoon et al. |
| 10,714,192 | B2 | 7/2020 | Tokutomi et al. |
| 2013/0148436 | A1 | 6/2013 | Kurosawa |
| 2014/0269055 | A1 * | 9/2014 | Kurosawa ............ G11C 16/349 365/185.24 |

FOREIGN PATENT DOCUMENTS

| JP | 2013122804 A | 6/2013 |
| JP | 2018163724 A | 10/2018 |
| JP | 202047339 A | 3/2020 |

* cited by examiner

*Primary Examiner* — Son T Dinh
(74) *Attorney, Agent, or Firm* — Maier & Maier, PLLC

(57) ABSTRACT

A memory controller receives first, second, and third data by first, second, and third reads, specifying a first address, and respectively specifying first, second, and third read voltages higher in this order. The controller instructs a memory to execute a fourth read specifying a fourth read voltage lower than the first read voltage and the first address when a first difference between a first-value-bit count of the first data and an expected value is smaller than a second difference between a first-value-bit count of the third data and the expected value. The memory controller instructs the memory to execute a fifth read specifying a fifth read voltage higher than the third read voltage and the first address when the first difference is larger than the second difference.

20 Claims, 19 Drawing Sheets

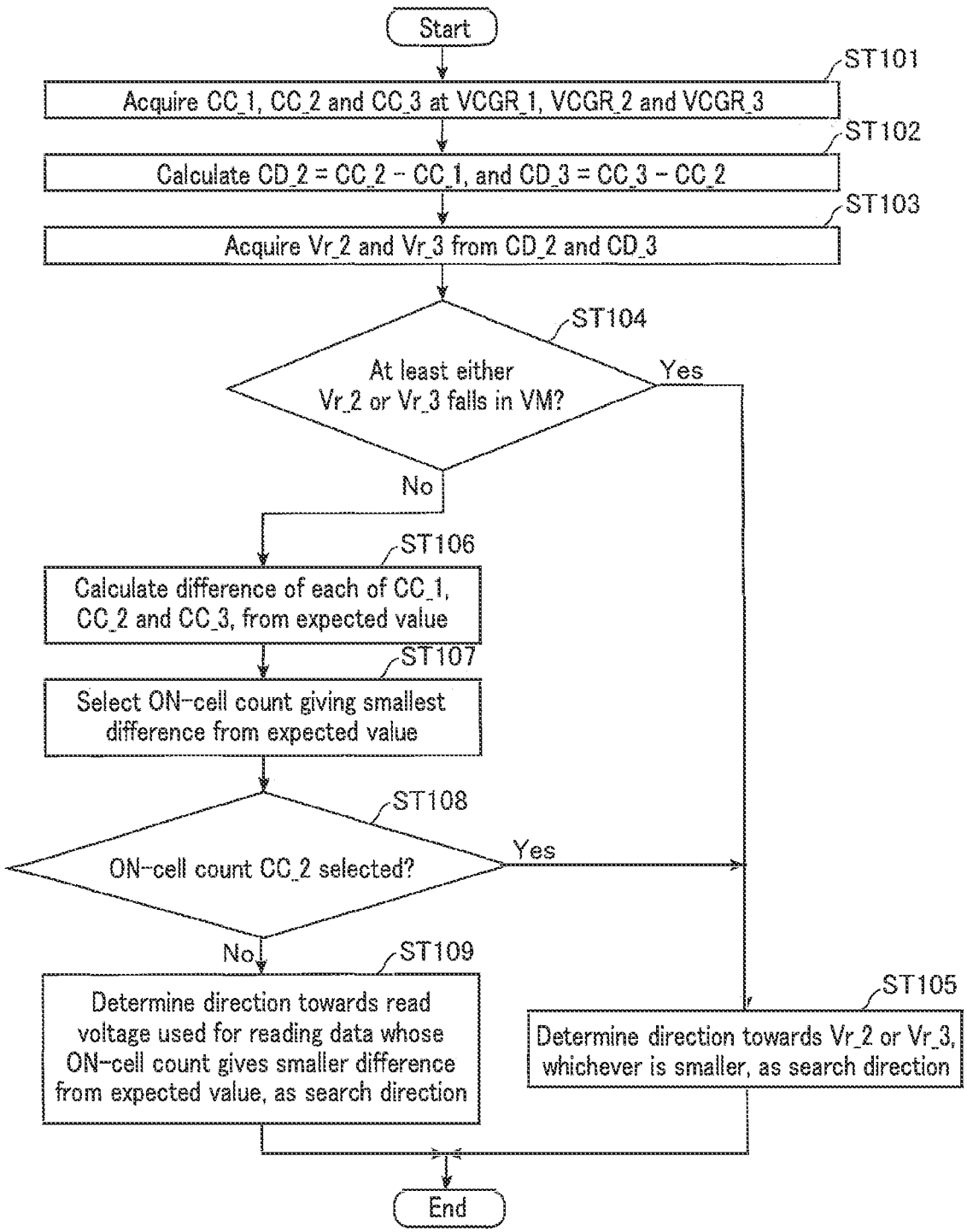
F I G. 10

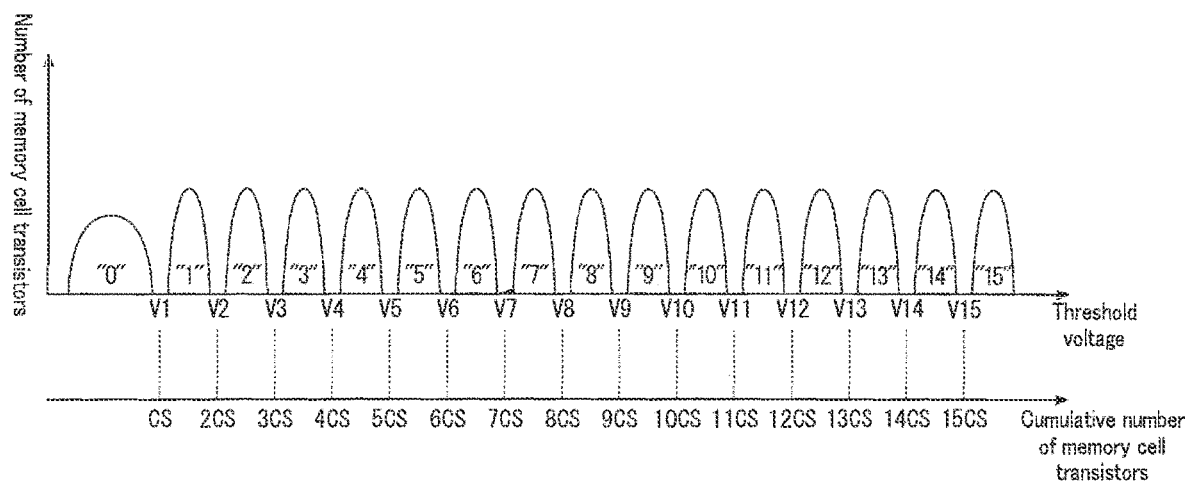
F I G. 13

MEMORY SYSTEM AND METHOD FOR CONTROLLING SEMICONDUCTOR MEMORY

CROSS-REFERENCE TO RELATED APPLICATIONS

This application is based upon and claims the benefit of priority from Japanese Patent Application No. 2022-094575, filed Jun. 10, 2022, the entire contents of which are incorporated herein by reference.

FIELD

Embodiments described herein relate generally to a memory system and a method for controlling a semiconductor memory.

BACKGROUND

A memory system that contains a memory, and a controller that controls the memory, has been known. The memory system is required to be highly reliable in reading data.

BRIEF DESCRIPTION OF THE DRAWINGS

FIG. 10 illustrates a flow for determining a search direction, executed by the memory controller of the memory system of the first embodiment.

FIG. 13 illustrates an example of expected values used in the memory system of the first embodiment.

DETAILED DESCRIPTION

In general, according to one embodiment, a memory system includes a semiconductor memory, and a memory controller. The memory controller is configured to receive, from the semiconductor memory, first data obtained by a first read, the first read specifying a first read voltage and a first address. The memory controller is configured to receive, from the semiconductor memory, second data obtained by a second read, the second read specifying a second read voltage higher than the first read voltage and the first address. The memory controller is configured to receive, from the semiconductor memory, third data obtained by a third read, the third read specifying a third read voltage higher than the second read voltage and the first address. The memory controller is configured to instruct the semiconductor memory to execute a fourth read specifying a fourth read voltage lower than the first read voltage and the first address, when a first difference between a first number of bits of a first value in the first data and an expected value is smaller than a second difference between a second number of bits of the first value in the third data and the expected value. The memory controller is configured to instruct the semiconductor memory to execute a fifth read specifying a fifth read voltage higher than the third read voltage and the first address, when the first difference is larger than the second difference.

Embodiments will now be described with reference to the figures.

The figures are schematic. The entire description of a particular embodiment applies to another embodiment unless an explicit mention is made otherwise, or an obvious elimination is involved. Thus, a description of a certain embodiment, in principle, does not include the same content as the description of a preceding embodiment, unless where necessary. A plurality of components having substantially the same function and configuration in a certain embodiment or over different embodiments may be denoted by reference signs with suffix numerals or characters for the purpose of distinction.

Each functional block may be implemented as hardware, computer software, or their combination.

Steps in the flow of a method according to an embodiment may occur in an order different from the illustrated orders and/or may occur concurrently with another step or steps.

The specification and the claims, when mentioning that a particular (first) component is "coupled" to another (second) component, intend to cover both the form of the first component directly coupled to the second component and the form of the first component coupled to the second component via one or more components which are always or selectively conductive.

1. First Embodiment

1.1. Structure (Configuration)

1.1.1. Memory System

Figure 1:
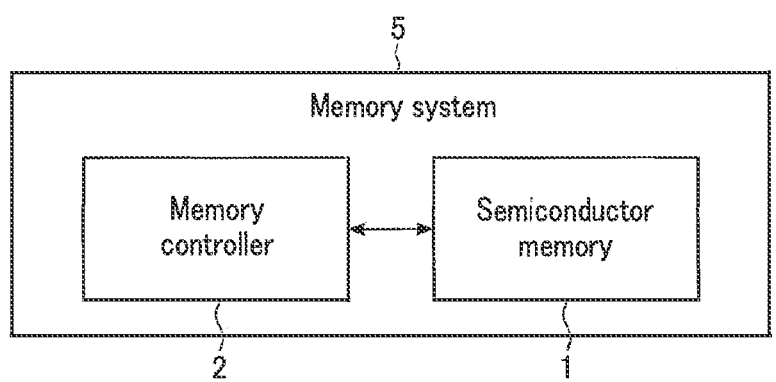
FIG. 1 illustrates components, coupling, and related components of a memory system of a first embodiment.

FIG. 1 illustrates an example of components and a coupling of a memory system 5 according to the first embodiment.

The memory system 5 is a system that receives requests to process data from a host device (not illustrated) and performs various processes including storage of data and reading of data based on the received request. Examples of the memory system 5 include a solid state drive (SSD) and various memory cards.

As illustrated in FIG. 1, the memory system 5 includes a semiconductor memory 1 and a memory controller 2. The semiconductor memory 1 is a memory that stores data in a nonvolatile manner. The semiconductor memory 1 includes one or more semiconductor chips. The semiconductor memory 1 is, for example, a NAND flash memory. The following description is based on an example in which the semiconductor memory 1 is a NAND flash memory.

The memory controller 2 is a controller that controls the semiconductor memory 1. The memory controller 2 controls the semiconductor memory 1 so as to perform the processes indicated by the requests from the host device (not shown). Examples of the form of the memory controller 2 include a semiconductor chip and a system on a chip (SoC).

1.1.2. Memory Controller

Figure 2:
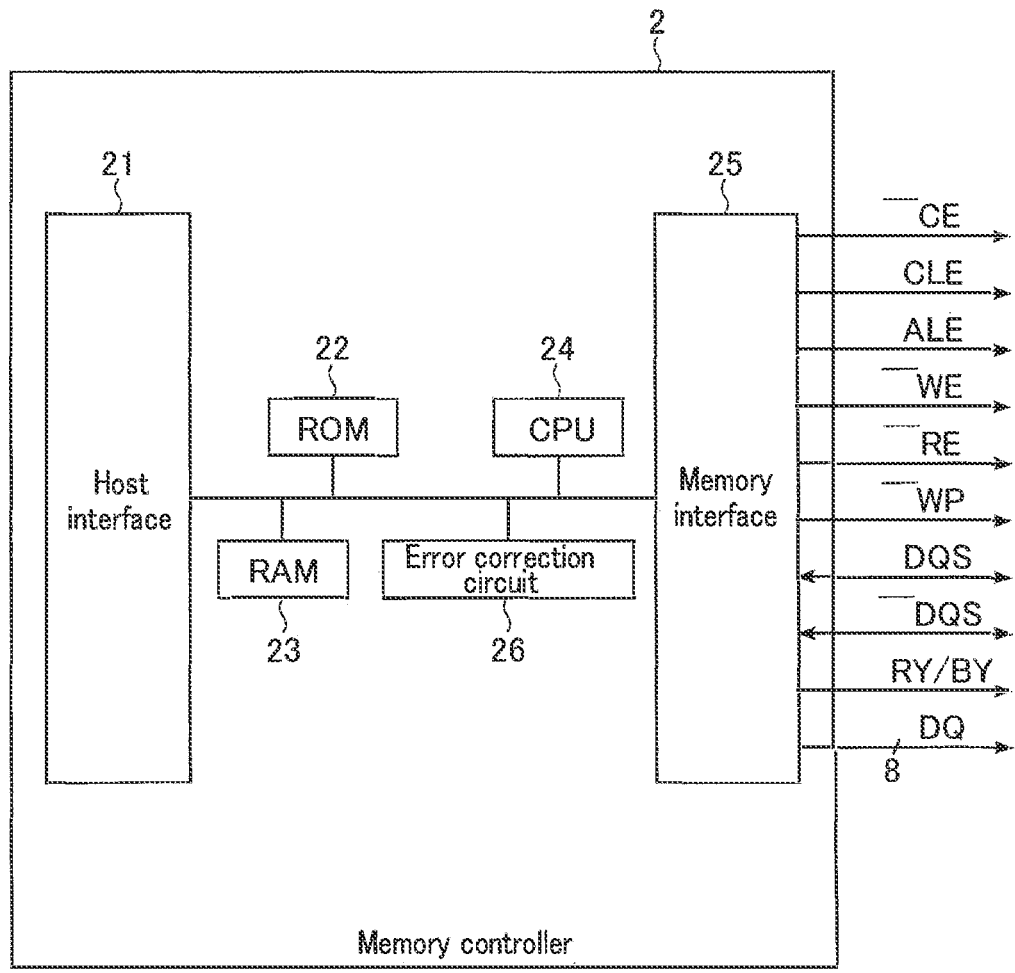
FIG. 2 illustrates an example of the components and couplings of the components, in the memory controller of the first embodiment.

FIG. 2 illustrates an example of components and couplings of the memory controller 2 according to the first embodiment.

The memory controller 2 includes a host interface 21, a read only memory (ROM) 22, a random access memory (RAM) 23, a central processing unit (CPU) 24, a memory interface 25, and an error correction circuit 26.

The host interface 21 is an interface for the memory controller 2 to communicate with the host device. The host interface 21 can include hardware or a combination of hardware and software. The host interface 21 is coupled to the host device according to the communication standard with which the host interface 21 is compliant.

The ROM 22 is a nonvolatile memory. Examples of the ROM 22 include an electrically erasable programmable read only memory (EEPROM). The ROM 22 stores a program including firmware.

The RAM 23 is a volatile memory. The RAM 23 temporarily stores data, and stores a program stored in the ROM 22 while the memory system 5 is supplied with power. Examples of the RAM 23 include a dynamic random access memory (DRAM).

The CPU 24 is a circuit that controls the entire operation of the memory controller 2. The memory controller 2 performs various operations by the CPU 24 executing a program stored in the ROM 22 and loaded in the RAM 23. The firmware is configured to cause the CPU 24 to perform operations described in the embodiments.

The error correction circuit 26 may be materialized as an independent dedicated semiconductor chip, may be a circuit formed on a semiconductor substrate, or may be realized by the CPU 24 as a result of executing firmware. The error correction circuit 26 detects and corrects an error in data written to the semiconductor memory 1 and data read from the semiconductor memory 1, with use of an error correction code (ECC). The error correction circuit 26 generates the error correction code from data (substantial write data) to be written in the semiconductor memory 1. The error correction code thus generated from the substantial write data is added to the substantial write data, based on a mode of generation of the error correction code. The error correction circuit 26 generates the error correction code, for every portion with a certain size of data received by the error correction circuit 26. The substantial write data, and the error correction code generated from the substantial write data are written in the semiconductor memory 1. The error correction circuit 26 detects one or more errors in the data read from the semiconductor memory 1 with use of the error correction code, and corrects the errors if detected.

The memory interface 25 is an interface for the memory controller 2 to communicate with the semiconductor memory 1. The memory interface 25 can include hardware or a combination of hardware and software. The memory interface 25 is coupled to the semiconductor memory 1 by interconnects for enabling communication of a type based on the type of the semiconductor memory 1. Based on an example in which the semiconductor memory 1 is a NAND flash memory, the memory interface 25 is a NAND memory interface.

A set of interconnects based on the NAND memory interface transmits a plurality of control signals and an input/output signal DQ. The control signals include signals $^-$CE, CLE, ALE, $^-$WE, $^-$RE, and $^-$WP, data strobe signals DQS and $^-$DQS, and a ready/busy signal RY/BY. The sign "$^-$" indicates logic obtained by inverting logic of a signal having a name without the sign "$^-$". The semiconductor memory 1 receives the input/output signal DQ and transmits the input/output signal DQ. The input/output signal DQ has, for example, an 8-bit width and includes a command (CMD), write data or read data (DAT), address information (ADD), and a status (STA).

The signal $^-$CE enables the semiconductor memory 1. The signal CLE notifies the semiconductor memory 1 of the transmission of the command by the input/output signal DQ. The signal ALE notifies the semiconductor memory 1 of the transmission of the address information by the input/output signal DQ. The signal $^-$WE instructs the semiconductor memory 1 to capture the input/output signal DQ. The signal $^-$RE instructs the semiconductor memory 1 to output the input/output signal DQ. The ready/busy signal RY/BY indicates whether the semiconductor memory 1 is in a ready state or a busy state, and indicates the busy state by a low level. The semiconductor memory 1 receives a command in the ready state, and does not receive a command in the busy state.

1.1.3. Semiconductor Memory

Figure 3:
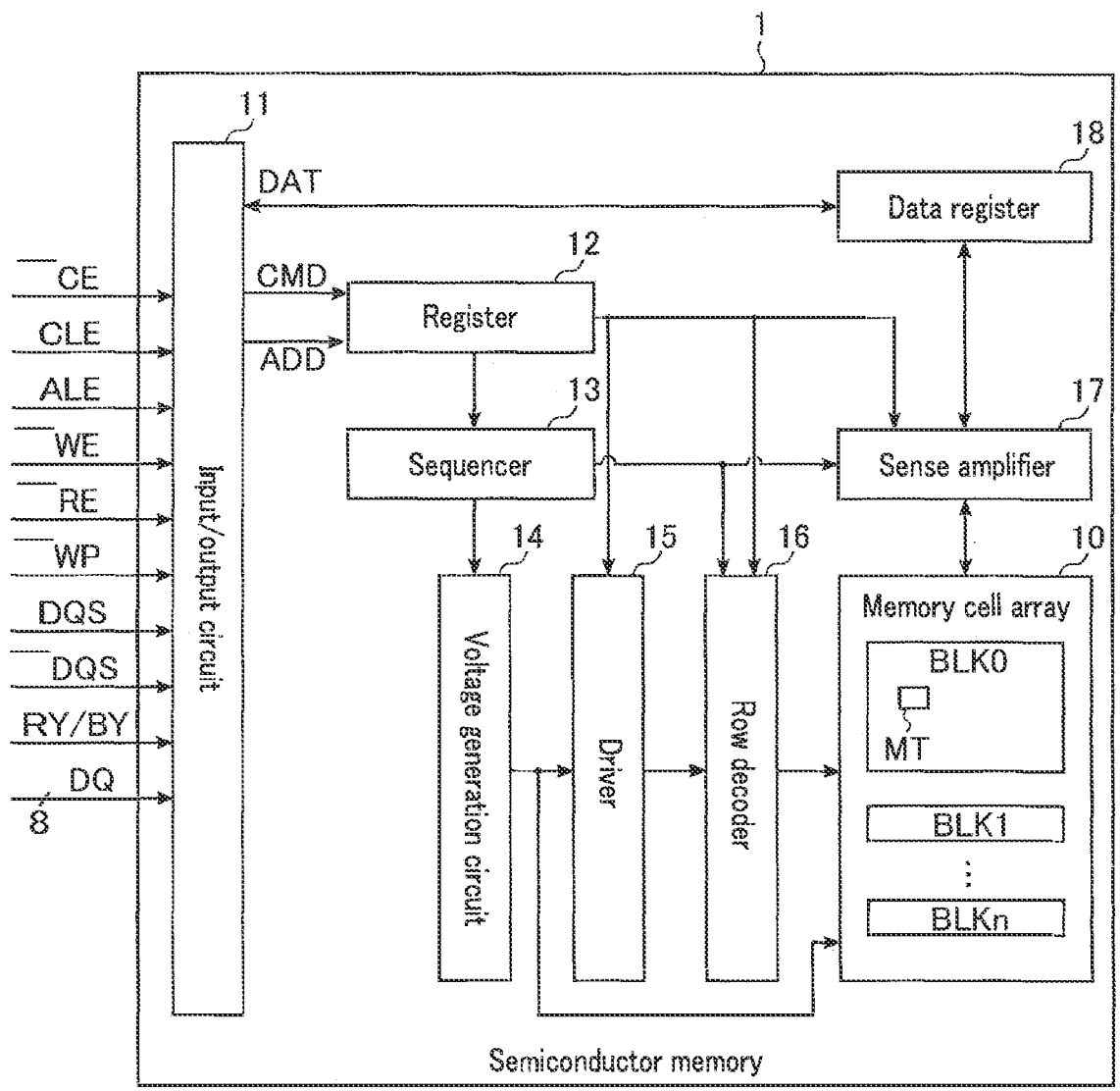
FIG. 3 illustrates an example of the components and couplings of the components, in the memory of the first embodiment.

FIG. 3 illustrates an example of components and couplings of the semiconductor memory 1 according to the first embodiment. The semiconductor memory 1 includes components such as a memory cell array 10, an input/output circuit 11, a register 12, a sequencer 13, a voltage generation circuit 14, a driver 15, a row decoder 16, a sense amplifier 17, and a data register (data cache) 18.

The memory cell array 10 is a set of arrayed memory cells. The memory cell array 10 includes a plurality of memory blocks (block) BLK (BLK0, BLK1, . . . ). Each block BLK includes a plurality of memory cell transistors MT. Word lines WL (not illustrated) and bit lines BL (not illustrated) are also positioned in the memory cell array 10.

The input/output circuit 11 is coupled to the memory controller 2 by the interconnects based on the NAND memory interface.

The register 12 is a circuit that holds the command CMD and the address information ADD received by the memory controller 2. The command CMD instructs the sequencer 13 to perform various operations including data reading, data writing, and data erasing. The address information ADD includes, for example, a block address, a page address, and a column address. The block address, the page address, and the column address designate a block BLK, a word line WL, and a bit line BL, respectively.

The sequencer 13 is a circuit that controls the entire operation of the semiconductor memory 1. The sequencer 13 controls the voltage generation circuit 14, the row decoder 16, and the sense amplifier 17 based on the command CMD received from the register 12 to perform various operations including data reading, data writing, and data erasing.

The voltage generation circuit 14 is a circuit that generates voltages having a plurality of different magnitudes. The voltage generation circuit 14 receives a power supply voltage from the outside of the semiconductor memory 1 and generates a plurality of voltages from the power supply voltage. The generated voltages are supplied to components such as the memory cell array 10 and the driver 15. By applying various voltages, voltages are applied to various components and interconnects in the semiconductor memory 1.

The driver 15 is a circuit that applies various voltages necessary for the operation of the semiconductor memory 1 to some of the components. The driver 15 receives a plurality of voltages from the voltage generation circuit 14 and supplies a selected one of the plurality of voltages to the row decoder 16.

The row decoder 16 is a circuit for selecting a block BLK. The row decoder 16 transfers the potentials supplied from the driver 15 to a single block BLK selected based on the block address received from the register 12.

The sense amplifier 17 is a circuit that determines data stored in the memory cell array 10. The sense amplifier 17 senses the states of the memory cell transistors MT and generates read data or transfers write data to the memory cell transistors MT based on the sensed states.

The data register 18 is a circuit that holds data for data input and output by the semiconductor memory 1. The data register 18 receives the data DAT received by the semiconductor memory 1 and provides data based on the received data DAT to the sense amplifier 17. The data register 18 receives data from the sense amplifier 17 and supplies the data DAT based on the received data to the input/output circuit 11.

1.1.4. Memory Cell Array

Figure 4:
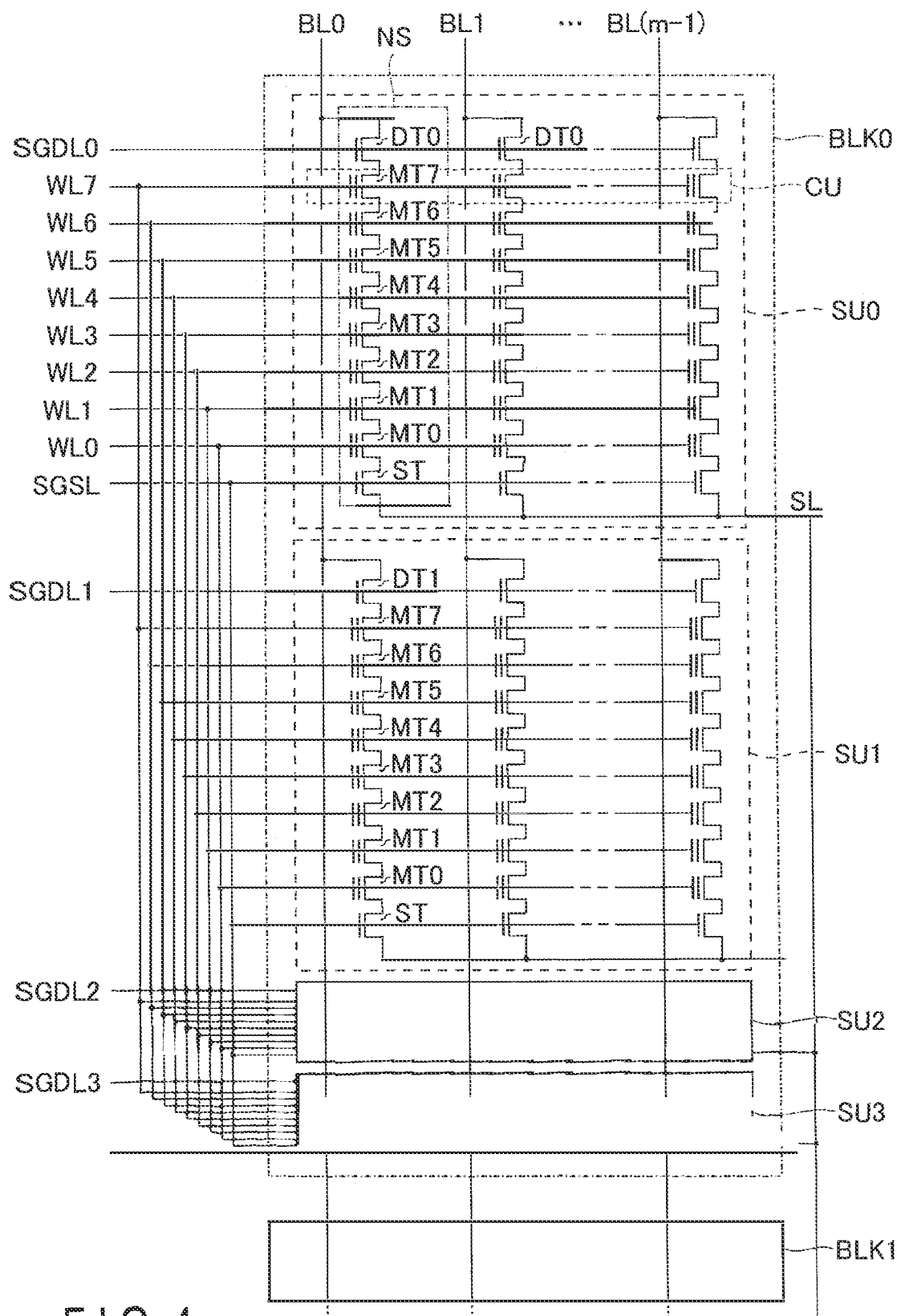
FIG. 4 illustrates an example of the components and couplings of the components, in a part of a memory cell array of the first embodiment.

FIG. 4 illustrates an example of some components and couplings of a part of the memory cell array 10 according to the first embodiment, and illustrates components and couplings of a single block BLK0 and related components. The plurality of blocks BLK, for example, all the blocks BLK, include components and couplings of components illustrated in FIG. 4.

A single block BLK includes a plurality of (for example, four) string units SU0 to SU3.

Each of a number m (where, m is a positive integer) of bit lines BL0 to BL(m−1) is coupled to a single NAND string NS from each of the string units SU0 to SU3 in each block BLK.

Each of NAND strings NS includes a single select gate transistor ST, a plurality of (for example, eight) memory cell transistors MT (MT0 to MT7), and a single select gate transistor DT (DT0, DT1, DT2, or DT3). The transistors ST, MT, and DT are coupled in series between a source line SL and a single bit line BL in this order. Each memory cell transistor MT includes a control gate electrode (or, word line WL) and a charge storage layer insulated from the surroundings, and can store data in a nonvolatile manner based on the amount of charges in the charge storage layer.

A single string unit SU includes NAND strings NS coupled to the plurality of different bit lines BL. In each string unit SU, the control gate electrodes of the memory cell transistors MT0 to MT7 are coupled to the word lines WL0 to WL7, respectively. A set of memory cell transistors MT sharing a word line WL in a single string unit SU is referred to as a cell unit CU.

The select gate transistors DT0 to DT3 (FIG. 4 does not illustrate DT2 and DT3) belong to the string units SU0 to SU3, respectively. The gate of the select gate transistor DT0 of each of the plurality of NAND strings NS of the string unit SU0 is coupled to a select gate line SGDL0. Similarly, the gates of the select gate transistors DT1, DT2, and DT3 of the plurality of NAND strings NS of the string units SU1, SU2, and SU3 are coupled to select gate lines SGDL1, SGDL2, and SGDL3, respectively.

The gate of the select gate transistor ST is coupled to a select gate line SGSL.

1.2. Operation 1.2.1. Data Storage by Memory Cell Transistors

Figure 5:
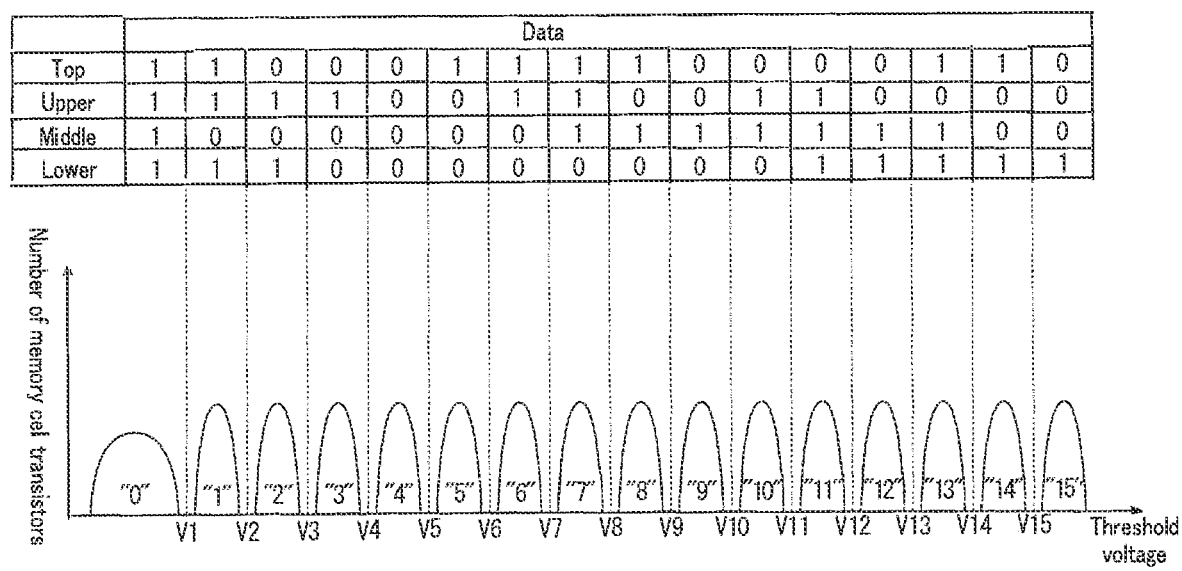
FIG. 5 schematically illustrates an exemplary structure of a part of the memory cell array of the first embodiment.

The semiconductor memory 1 can store two or more bits of data in a single memory cell transistor MT. FIG. 5 illustrates an example of distribution of threshold voltages of the memory cell transistors MT storing 4-bit data of the memory system 5 according to the first embodiment and the mapping of the data. The threshold voltage of each memory cell transistor MT has a magnitude corresponding to the stored data based on the amount of electrons in the charge storage layer IA. In the case where 4 bits are stored per memory cell transistor MT, each memory cell transistor MT can be in a single state according to the threshold voltage among 16 states. The 16 states are referred to as "0", "1", "2", "3", "4", "5", "6", "7", "8", "9", "10", "11", "12", "13", "14", and "15" states. The memory cell transistors MT in the "0" state, the "1" state, the "2" state, the "3" state, the "4" state, the "5" state, the "6" state, the "7" state, the "8" state, the "9" state, the "10" state, the "11" state, the "12" state, the "13" state, the "14" state, and the "15" state have higher threshold voltages in this order.

By data writing, a write target memory cell transistor MT is kept in the "0" state or shifted to any one of the "1" state, the "2" state, the "3" state, the "4" state, the "5" state, the "6" state, the "7" state, the "8" state, the "9" state, the "10" state, the "11" state, the "12" state, the "13" state, the "14" state, and the "15" state based on the data to be written. The threshold voltage of the memory cell transistor MT in the "0" state is not increased by data writing. However, hereinafter, keeping the memory cell transistor MT in the "0" state by data writing may be also referred to as data writing.

4-bit data can be assigned to each state in any form. An example will be described below. As an example, the memory cell transistor MT in each state is treated as having the following 4-bit data. Regarding "ABCD" in the following description, A, B, C, and D indicate values of top, upper, middle, and lower bits, respectively.

The "0" state: "1111"
The "1" state: "1101"
The "2" state: "0101"
The "3" state: "0100"
The "4" state: "0000"
The "5" state: "1000"
The "6" state: "1100"
The "7" state: "1110"

The "8" state: "1010"
The "9" state: "0010"
The "10" state: "0110"
The "11" state: "0111"
The "12" state: "0011"
The "13" state: "1011"
The "14" state: "1001"
The "15" state: "0001"

Even a plurality of memory cell transistors MT that store the same 4-bit data may have different threshold voltages. In distribution of the threshold voltages, a portion including a set of threshold voltages belonging to each state may be referred to as a lobe of the threshold voltages or a threshold voltage lobe.

The state of a read target memory cell transistor MT is determined in order to determine data stored in the memory cell transistor MT as the data read target. A plurality of read voltages VCGR having different magnitudes are used to determine which state the read target memory cell transistor MT is in. The range of the threshold voltage of the read target memory cell transistor MT is used to determine the state of the read target memory cell transistor MT. In order to determine the range of the threshold voltage of the read target memory cell transistor MT, it is determined whether the read target memory cell transistor MT has a threshold voltage equal to or higher than a certain read voltage VCGR. The memory cell transistor MT having a threshold voltage equal to or higher than the read voltage VCGR remains OFF even while the memory cell transistor MT is receiving the read voltage VCGR at its control gate electrode. On the other hand, the memory cell transistor MT having a threshold voltage lower than the read voltage VCGR remains ON while the memory cell transistor MT is receiving the read voltage VCGR at its control gate electrode. Based on this, it can be determined that the read target memory cell transistor MT that is receiving the read voltage VCGR of a certain magnitude but remains OFF has a threshold voltage higher than the read voltage VCGR.

Reads for determining whether the read target memory cell transistor MT is in a state higher than the "0" state, the "1" state, the "2" state, the "3" state, the "4" state, the "5" state, the "6" state, the "7" state, the "8" state, the "9" state, the "10" state, the "11" state, the "12" state, the "13" state, and the "14" state are referred to as 1R (or, read), 2R, 3R, 4R, 5R, 6R, 7R, 8R, 9R, 10R, 11R, 12R, 13R, 14R, and 15R, respectively. In 1R, 2R, 3R, 4R, 5R, 6R, 7R, 8R, 9R, 10R, 11R, 12R, 13R, 14R, and 15R, read voltages V1, V2, V3, V4, V5, V6, V7, V8, V9, V10, V11, V12, V13, V14, and V15 are used, respectively. The read target memory cell transistor MT that is receiving the read voltages V1, V2, V3, V4, V5, V6, V7, V8, V9, V10, V11, V12, V13, V14, and V15 at the control gate but remains OFF is respectively the "1" state, the "2" state, the "3" state, the "4" state, the "5" state, the "6" state, the "7" state, the "8" state, the "9" state, the "10" state, the "11" state, the "12" state, the "13" state, the "14" state, the "15" state, or a higher state.

The read voltage V1 is higher than the highest threshold voltage of the memory cell transistor MT in the "0" state, and lower than the lowest threshold voltage of the memory cell transistor MT in the "1" state immediately after being written.

Similarly, in each case with α (where, α represents a natural number) ranging from 2 to 15, the read voltage Vα is higher than the highest threshold voltage of the memory cell transistor MT in a "(α−1)" state immediately after being written, and lower than the lowest threshold voltage of the memory cell transistor MT in an "α" state immediately after being written.

A set of data of bits at the same position (digit) in the memory cell transistors MT of a single cell unit CU corresponds to one page. A set of data of the least significant (i.e., first digit from the bottom) bits, or lower bits, of the memory cell transistors MT of each cell unit CU is referred to as a lower page. A set of data of the second least significant bits, or middle bits, of the memory cell transistors MT of each cell unit CU is referred to as a middle page. A set of data of the third least significant bits, or upper bits, of the memory cell transistors MT of each cell unit CU is referred to as an upper page. A set of data of the most significant (i.e., fourth digit from the bottom) bits, or top bits, of the memory cell transistors MT of each cell unit CU is referred to as a top page.

By data erasing, the threshold voltage of an erase target memory cell transistor MT is lowered and the erase target memory cell transistor MT is shifted to the "0" state.

The following description is based on an example in which four-page data is stored for every cell unit CU.

Even in a period over which the memory cell transistor MT stores the same data, the threshold voltage of the memory cell transistor MT unintentionally varies as the semiconductor memory 1 is used, and with time. Hence, the threshold voltage distribution of memory cell transistors MT may be different from the distribution immediately after writing of data in the memory cell transistors MT. In a varied threshold voltage distribution, adjacent threshold voltage lobes partially overlap. Overlapping of the threshold voltage lobes may occur in every set of two adjacent threshold voltage lobes.

Figure 6:
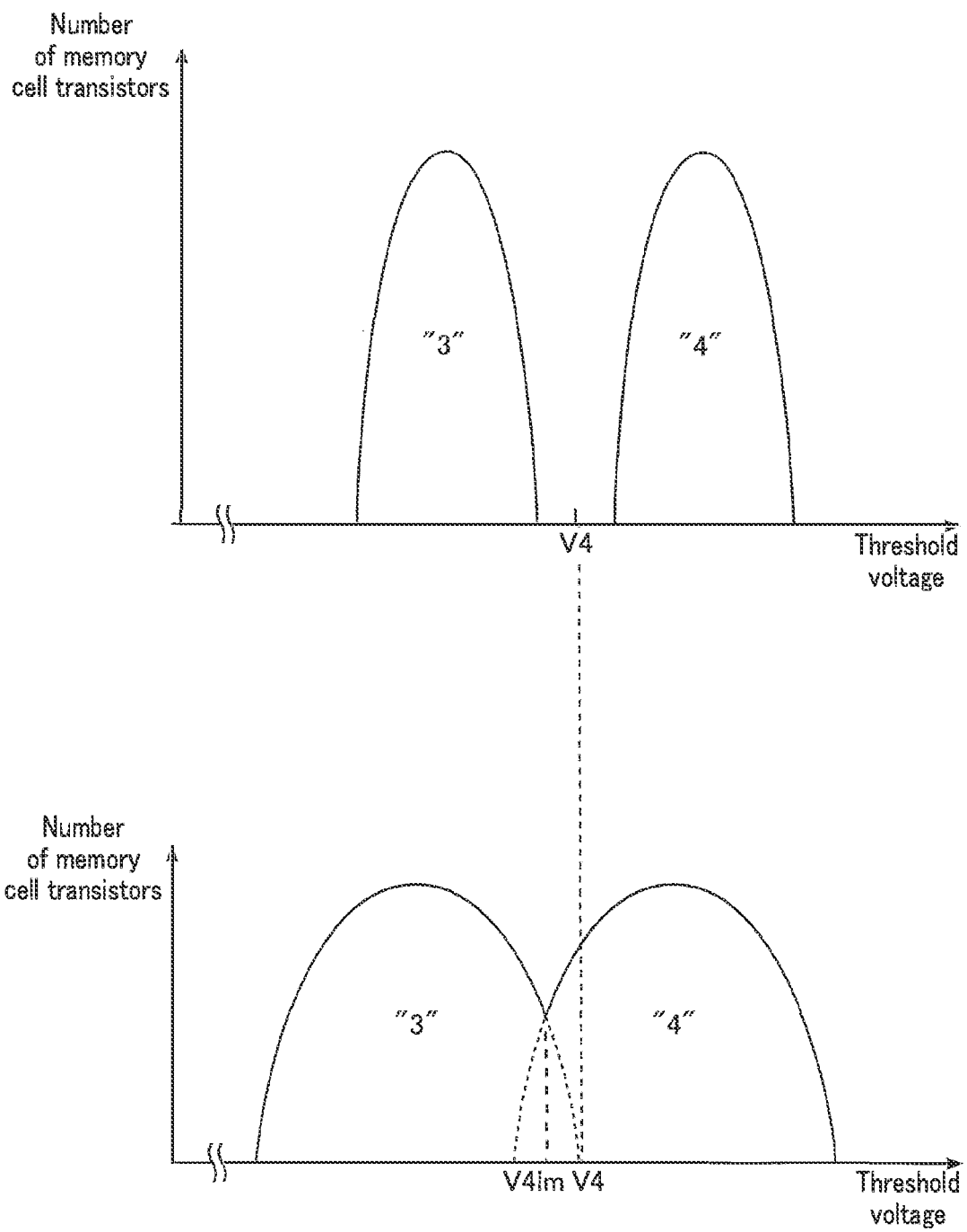
FIG. 6 illustrates an example of a temporary change of a threshold voltage distribution in the semiconductor memory of the memory system of the first embodiment.

FIG. 6 illustrates an example of a temporal change of a threshold voltage distribution in the semiconductor memory of the memory system of the first embodiment. FIG. 6 illustrates, as an example of adjacent threshold voltage lobes, the "3" state and the "4" state for a cell unit CU. As illustrated in the top tier of FIG. 6, the threshold voltage lobe of the "3" state and the threshold voltage lobe of the "4" state, immediately after the data writing, are independent from each other. However, upon change of the threshold voltage, a right part of the threshold voltage lobe of the state "3" and a left part of the threshold voltage lobe of the state "4" overlap, making the two threshold voltage lobes integrated, as illustrated in the bottom tier of FIG. 6. This creates a local minimum value in the threshold distribution that contains the two threshold voltage lobes. In some cases, use of the read voltage V4 would not be suitable for determining whether each of the memory cell transistors MT that demonstrate such threshold voltage distribution resides in the "3" state or lower state, or in the "4" state or higher state. That is, with use of the read voltage V4, a memory cell transistor MT could be misjudged to reside in a state different from the state in which it actually resides. This leads to erroneous data reading.

In this case, in whichever of the "3" state or the "4" state does the memory cell transistor MT reside can be precisely determined by using, as the read voltage VCGR, the threshold voltage of a memory cell transistor MT that resides at the local minimum value in the threshold voltage distribution. This requires estimation of a point (local minimum point) at which the local minimum value resides. The local minimum point to be estimated depends on two adjacent states in one of which the memory cell transistor MT can reside, due to read executed later by using the voltage at the local minimum point as the read voltage VCGR. In the example of FIG. 6, the local minimum point to be estimated is a local minimum point between the lobe of the "3" state and the lobe of the "4" state. Hereinafter, the minimum point to be estimated may be referred to as a target local minimum point. The default read voltage VCGR between two adjacent states that constitutes the target local minimum point may be referred to as a default read voltage VCGR that corresponds to the target local minimum point. In the example of FIG. 6, the default read voltage that corresponds to the target local minimum point is given by the read voltage V4. The read voltage that corresponds to the estimated local minimum point is given by a read voltage V4*lm*.

1.2.3. Types of Data Read

The memory controller 2 can instruct a plurality of types of read described below, meanwhile the semiconductor memory 1 can recognize the instruction for any of the types of read described below, and can execute the instructed read.

Figure 7:
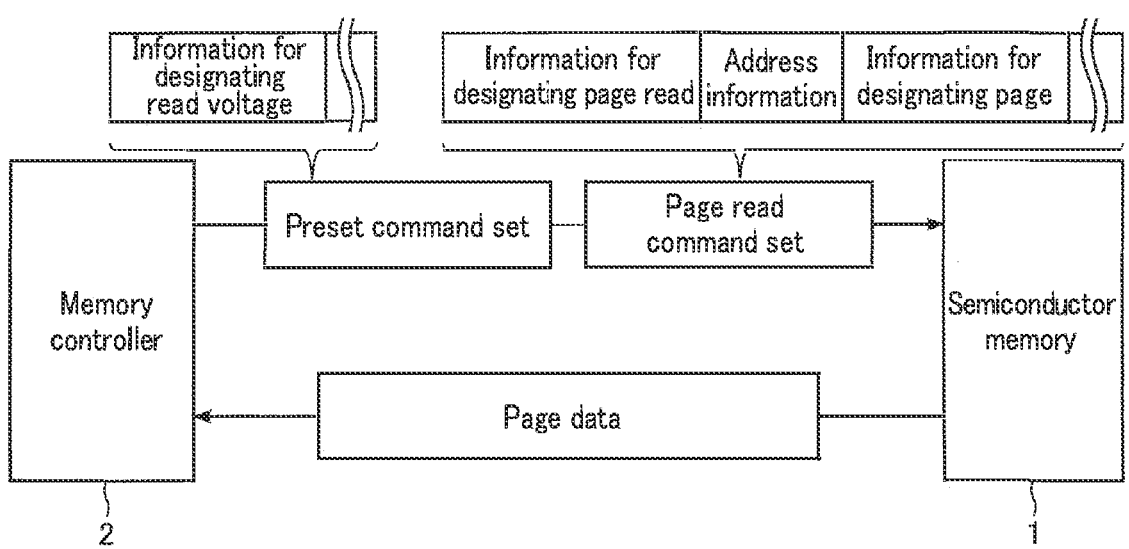
FIG. 7 illustrates an example of a signal that is sent and received during page read in the memory system of the first embodiment.

The types of read include page read and single state read. The page read is to read data of one page (i.e., top, upper, middle, or lower page) described with reference to FIG. 5. FIG. 7 illustrates an example of a signal that is sent and received during page read in the memory system of the first embodiment.

As illustrated in FIG. 7, the memory controller 2 transmits a page read command set to the semiconductor memory 1. The page read command set includes a bit string that specifies page read, address information ADD that designates a read target, and information that designates a target page to be read. A read target address specifies one cell unit CU.

Upon receiving the page read command set, the semiconductor memory 1 executes the designated page read. The page read uses a plurality of read voltages VCGR, according to the read target page. For an exemplary case of lower page read, the read voltages V3 and V11 are used, as exemplified in FIG. 5. By the page read, data of the designated page of the cell unit CU to be read is acquired in the semiconductor memory 1. The acquired data is sent to the memory controller 2, according to an instruction of the memory controller 2 (i.e., control by a read enable signal ⁻RE).

In some cases, the read voltage VCGR may be designated. Such cases use a preset command set. The preset command set includes information that designates the read voltage VCGR. The read voltage specified by the preset command set stays valid, typically until the next setting by the preset command set. Hence, the read voltage VCGR to be used for read based on the page read command set may be designated by a preset command set preceding the page read command set. The information that designates the read voltage may, for example, directly specify the read voltage, or may specify a difference from a reference (default, for example) read voltage. The read voltage may be designated for each read voltage, or for a plurality of read voltages. Information that designates the read voltage may be included in the page read command set.

Figure 8:
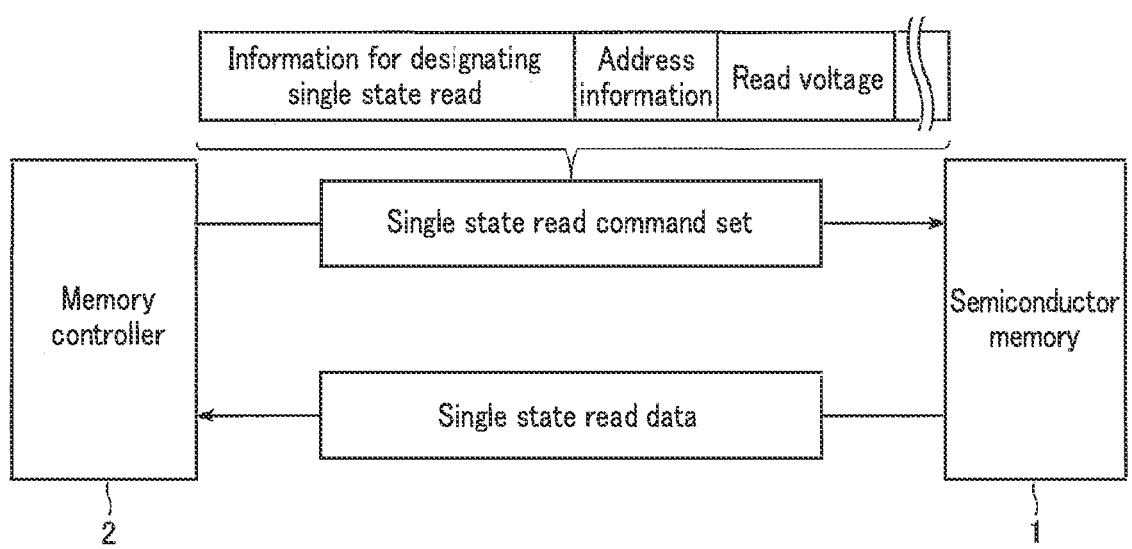
FIG. 8 illustrates an example of a signal that is sent and received during page read in the memory system of the first embodiment.

The single state read is same as read of data from the cell unit CU that stores data of one page. FIG. 8 illustrates an example of a signal that is sent and received during the single state read in the memory system of the first embodiment.

As illustrated in FIG. 8, the memory controller 2 transmits a single state read command set to the semiconductor memory 1. The single state read command set includes a bit string that designates the single state read, the address information ADD that specifies a read target, and information that designates the read voltage VCGR of a certain level. The read target address information ADD specifies one cell unit CU.

Upon receiving the single state read command set, the semiconductor memory 1 executes the single state read. The single state read uses only one read voltage VCGR. According to the single state read, 1-bit data of a certain value (for example, "1" data) is read from each of the memory cell transistors MR of the cell unit CU to be read, if the memory cell transistors MT have the threshold voltage lower than the read voltage VCGR, regardless of the state of the memory cell transistors MT. Meanwhile, according to the single state read, 1-bit data of another value (for example, "0" data) is read from each of the memory cell transistors MR of the cell unit CU to be read, if the memory cell transistors MT have the threshold voltage equal to or higher than the read voltage VCGR, regardless of the state of the memory cell transistors MT. Hence, as a result of the single state read, data constituted by a set of a plurality of bits (single state read data) determined based on the threshold voltage of a plurality of (all, for example) memory cell transistors MT of the cell unit CU to be read is acquired in the semiconductor memory 1. The single state read data is sent to the memory controller 2, upon instructed by the memory controller 2 (i.e., control by the read enable signal ⁻RE).

1.2.3. Local Minimum Search in Threshold Voltage Distribution

Figure 9:
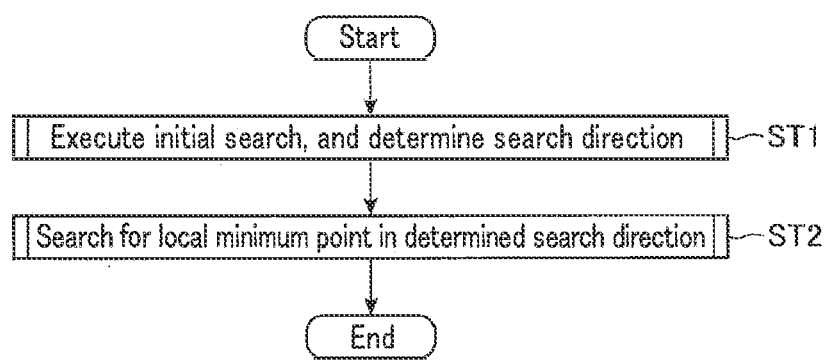
FIG. 9 illustrates a flow of an operation by the memory controller of the memory system of the first embodiment.

FIG. 9 illustrates a flow of an operation by the memory controller of the memory system of the first embodiment. More specifically, FIG. 9 illustrates a flow of the search for a target local minimum point in the threshold voltage distribution of the memory cell transistors MT of a cell unit CU, executed by the memory controller 2. The memory controller 2, particularly the CPU 24, executes the operations described below with reference to FIG. 9.

The flow of FIG. 9 is executed before the start of data read on a page of a cell unit CU. That is, the flow of FIG. 9 may be initiated by the memory controller 2, upon determination by the memory controller 2 on the necessity of determination of the level of a read voltage VCGR used for reading the page data. For example, the flow of FIG. 9 may be initiated, when the memory controller 2 acquires data of a page of a cell unit CU, and fails in error correction of the acquired page data with use of the error correction circuit 26.

The memory controller 2 executes an initial part of the local minimum point search (or, initial search), and determines a search direction (ST1). The search direction means a direction in which the minimum point search proceeds in a subsequent step. By the initial search, information used for the local minimum point search is obtained.

The memory controller 2 estimates the local minimum point (ST2). The local minimum point is estimated with use of the information obtained by the initial search. The local minimum point search is executed in the search direction determined in ST1. Upon end of ST2, the flow of the minimum point search comes to the end.

Once the local minimum point is estimated, the memory controller 2 can execute further page read from the cell unit CU, with use of the voltage at the local minimum point as the read voltage VCGR. ST2 may be executed for two or more of the read voltages VCGR necessary for the page read. For example, the memory controller 2 reads data from a page that stores data for which error correction has failed, and has triggered the flow of FIG. 9, with use of the voltage at the local minimum point as the read voltage VCGR. For example, upon confirming success of the error correction of the obtained data, the memory controller 2 stores information that specifies the voltage (or, the read voltage VCGR) at the local minimum point, and uses the specified read voltage VCGR in the next read of data from the same page.

1.2.3.1. Initial Search and Determination of Search Direction

FIG. 10 illustrates a flow of an operation executed by the memory controller of the memory system of the first embodiment. More specifically, FIG. 10 illustrates a subflow of the initial search and determination of search direction (ST1) illustrated in FIG. 9. The memory controller 2, particularly the CPU 24, executes the operations described below with reference to FIG. 10.

The memory controller 2 executes shift read three times to acquire ON-cell counts CC with respective three different levels of read voltages VCGR (ST101). The shift read refers to read that uses a read voltage VCGR whose level is different (or, shifted) from a certain level of read voltage VCGR used in a read. The shift read uses the single state read. The memory controller 2 transmits, to the semiconductor memory 1, a single state read command set that designates the read voltage VCGR to be used, for each shift read. Upon receiving the single state read command set, the semiconductor memory 1 executes the single state read according to the received command set, and transmits the obtained single state read data to the memory controller 2.

By the single state read that involves application of a read voltage VCGR, the memory cell transistors MT having the threshold voltage lower than the read voltage VCGR are turned on. The ON-cell count CC means the count of memory cell transistors MT that are turned on upon such application of a certain level of read voltage VCGR. The number of bits of data (for example, "1" data) having a value ascribed to the memory cell transistors MT that turned on, out of the single state read data, represents the ON-cell count CC. The memory controller 2 can acquire the ON-cell count CC in response to the read voltage VCGR, by counting the number of bits of a specific value (for example, "1" data) in the single state read data obtained by the single state read at a read voltage VCGR.

Figure 11:
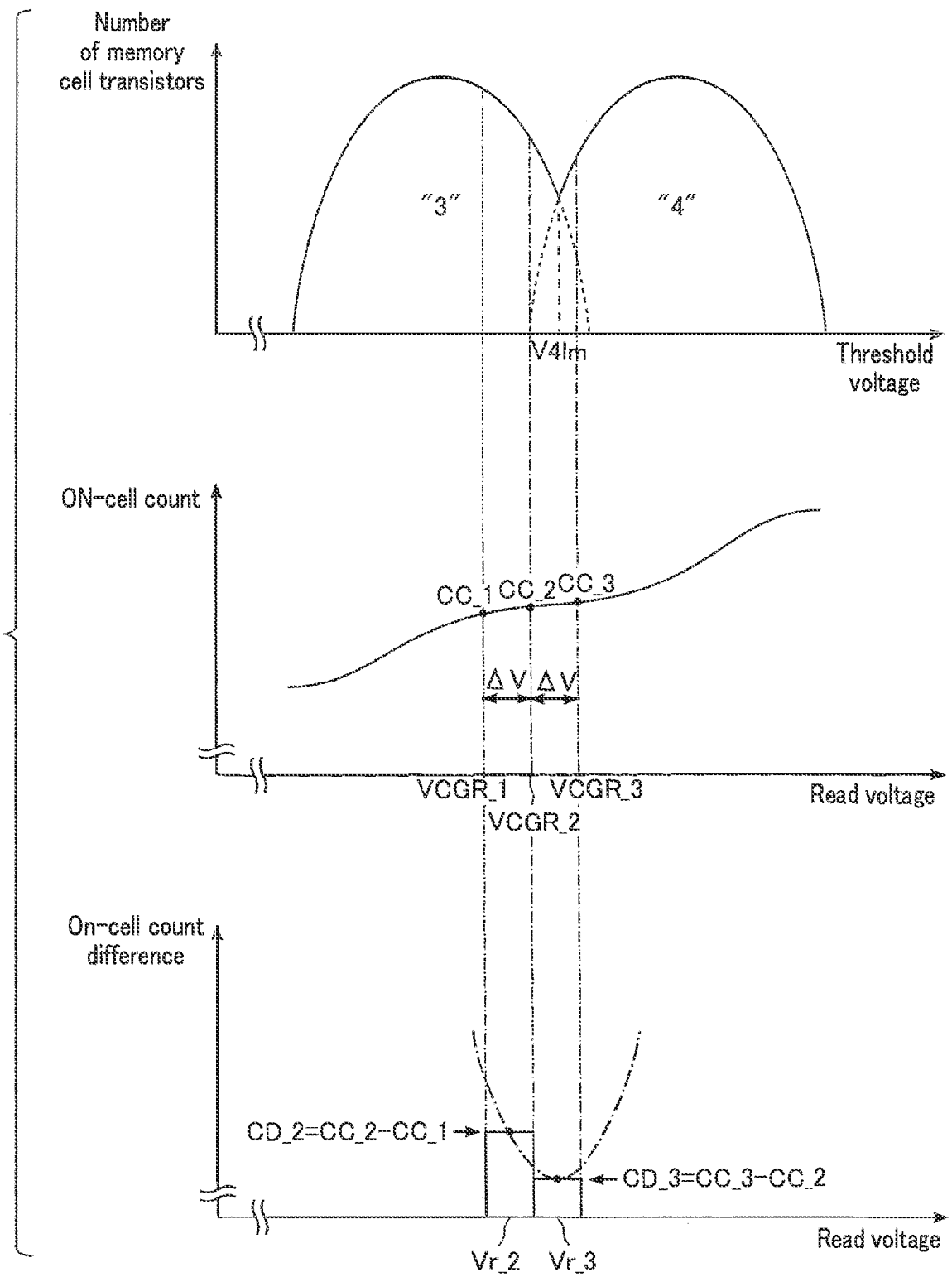
FIG. 11 illustrates a method of determining the ON-cell count and a threshold voltage in the memory system of the first embodiment.

The level of the read voltage VCGR in a shift read is different from the level of the read voltage VCGR in a shift read that precedes the shift read, by the shift voltage $\Delta V$. Hence, as illustrated in the middle tier of FIG. 11, the read voltages VCGR_1, VCGR_2, and VCGR_3 in the three shift reads satisfy the relations below. The read voltage VCGR_2 is higher than the read voltage VCGR_1, by the shift voltage $\Delta V$. The read voltage VCGR_3 is higher than the read voltage VCGR_2, by the shift voltage $\Delta V$. The read voltages VCGR_1, VCGR_2, and VCGR_3 may be used in any order. The number of memory cell transistors MT that can be turned on upon application of higher read voltage VCGR_ will be larger.

Hereinafter, the ON-cell count CC at read voltage VCGR_$\beta$, where $\beta$ represents a positive integer, is referred to as the ON-cell count CC_$\beta$. The ON-cell counts CC_3 is larger than the ON-cell count CC_2, which is larger than CC_1. The ON-cell counts CC_1, CC_2, and CC_3 are stored in the memory controller 2, typically by the RAM 23.

The levels of the read voltages VCGR_1, VCGR_2, and VCGR_3 may be determined by any method. For example, any one of the read voltages VCGR_1, VCGR_2, or VCGR_3 used first has a default level. More specifically, in an exemplary case of the search for the local minimum value in the threshold voltage distribution constituted by the threshold voltage lobe of the "3" state and the threshold voltage lobe of the "4" state, the read voltage V4 may be used. Alternatively, a value used in the previous read that provided the data having succeeded in the error correction may be used.

As illustrated in FIG. 10, the memory controller 2 acquires ON-cell count difference CD_2 and ON-cell count difference CD_3 (ST102). Letting $\gamma$ be an integer of 2 or larger, the ON-cell count difference CD_$\gamma$ is given by ON-cell count CC_$\gamma$ minus ON-cell count CC_$\gamma$−1. The ON-cell count difference CD_2 and the ON-cell count difference CD_3 are stored in the memory controller 2, typically by the RAM 23.

The ON-cell count difference CD_$\gamma$ corresponds to the number of memory cell transistors MT having the threshold voltage that falls in the range whose lower limit is given by read voltage VCGR_$\gamma$−1, and whose upper limit is given by read voltage VCGR_$\gamma$. For simplified process, the memory cell transistor MT, having a threshold voltage in the range from the read voltage VCGR_$\gamma$−1 and the read voltage VCGR_$\gamma$, is approximated to have a representative level of threshold voltage (ST103). The representative level usable herein is exemplified by the level at the middle of the range, as illustrated in the bottom tier of FIG. 11. That is, the memory cell transistor MT given by the ON-cell count difference CD_$\gamma$ is handled as having a threshold voltage of (VCGR_$\gamma$+VCGR_$\gamma$−1)/2. Hereinafter, the threshold voltage having the level of (VCGR_$\gamma$+VCGR_$\gamma$−1)/2 may be referred to as read voltage Vr_$\gamma$.

Figure 12:
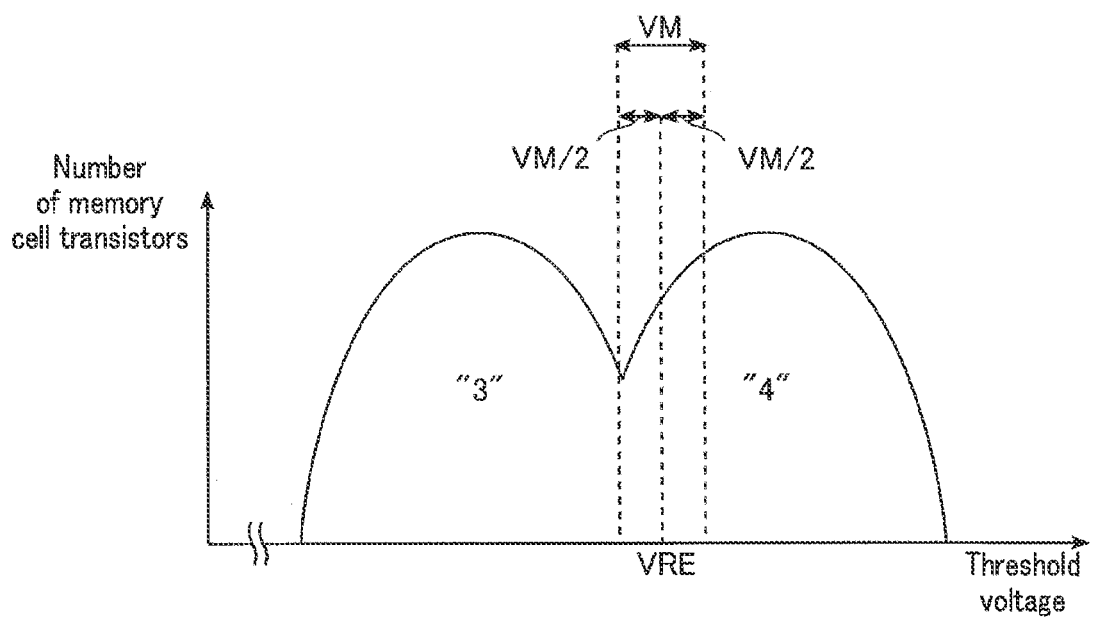
FIG. 12 illustrates an example of a range used in the memory system of the first embodiment.

As illustrated in FIG. 10, the memory controller 2 determines whether or not at least either read voltage Vr_2 or Vr_3 falls within a range VM (ST104). As illustrated in FIG. 12, the range VM has the upper limit and the lower limit according to reference voltage VRE described below. Upon success of the data correction of a page data read with use of a read voltage VCGR as described above with reference to FIG. 9, the memory controller 2 stores information that specifies the read voltage VCGR. The reference voltage VRE may be given by the read voltage VCGR used for the read of such page data having succeeded in the error correction. For an exemplary case of estimating the read voltage VCGR for distinguishing the "3" state and the "4" state of a certain first page according to the flow of FIG. 9 that contains the flow of FIG. 10, the read voltage VCGR for distinguishing the "3" state and the "4" state, used for the previous read of the data of the first page having succeeded in the error correction, is used as the reference voltage VRE. If a corresponding read voltage VCGR used for reading the page data having succeeded in the error correction is not available from the same page, the reference voltage VRE may be given by the default read voltage VCGR that corresponds to the target local minimum. The range VM typically includes the reference voltage VRE at the center of the range VM. That is, the range VM ranges from VRE−VM/2 to VRE+VM/2, on both sides of the reference voltage VRE.

The read voltages Vr_2 and Vr_3 obtained by the initial search being within the range VM means that the read voltages Vr_2 and Vr_3 are located in the vicinity of the default read voltage VCGR that corresponds to the target local minimum point. Hence the search direction towards the target local minimum point will be more likely to be determined, without executing further steps for determining the search direction. This enables omission of the further steps for determining the search direction. With the range set narrower, a situation in which the read voltage Vr_2 or Vr_3 in the range VM resides more close to the target local minimum point is detectable. Hence, with the narrower range VM, the further steps for determining the search direction will be more likely to be omitted. The narrower range VM, however, makes the read voltage Vr_2 or Vr_3 less likely to fall within the range VM.

On the contrary, wider range VM will make the read voltage Vr_2 or Vr_3 more likely to fall within the range VM. Hence the further steps for determining the search direction will be more likely to be omitted. This would, however, close the way to more precisely determine the search direction towards the target local minimum point by the further steps for determining the search direction.

The size of the range VM is therefore set considering the aforementioned issues to be discussed. For example, the range VM may be set equal to the shift voltage ΔV.

With either the read voltages Vr_2 or Vr_3 fallen within the range VM (ST104; Yes) as illustrated in FIG. 10, the situation means that the read voltages Vr_2 and Vr_3 are located in the vicinity of the default read voltage VCGR that corresponds to the target local minimum point. Based on this indication, the memory controller 2 determines a direction in which the local minimum point is searched by a subsequent step, on a distribution curve of the threshold voltage (ST105). The search direction of the local minimum point is determined from a larger one of the read voltages Vr_2 and Vr_3 towards a smaller one of the read voltages Vr_2 and Vr_3. More specifically, if the read voltage Vr_2 is smaller than the read voltage Vr_3, the search direction goes in a direction the voltage level decreases (i.e., negative direction of the voltage). Conversely if the read voltage Vr_3 is smaller than the read voltage Vr_2, the search direction goes in a direction the voltage level increases (i.e., positive direction of the voltage). The flow of FIG. 10 comes to the end upon execution of ST105.

In a case where neither the voltage Vr_2 nor Vr_3 falls within the range VM (ST104; No), the situation means that the read voltages Vr_2 and Vr_3 are located away from the default read voltage VCGR that corresponds to the target local minimum point. Based on this indication, the memory controller 2 determines the search direction of the local minimum point, with use of a method different from that in ST105.

First, the memory controller 2 estimates a difference of each of the ON-cell counts CC_1, CC_2, and CC_3, from the expected value EC (ST106). The expected value EC depends on the type of the target local minimum point. That is, the expected value EC depends on two states of the two individual threshold voltage lobes that constitute the target local minimum point. The expected value EC is based on the number of memory cell transistors MT theoretically assumed to reside in each state, and located in the vicinity of the target local minimum point. The expected value EC will be detailed later.

The memory controller 2 selects one of the ON-cell counts CC_1, CC_2, and CC_3 that minimizes the difference from the expected value EC (ST107).

The memory controller 2 determines whether the selected ON-cell count CC is the ON-cell count CC_2 or not (ST108). In a case where neither the read voltage Vr_2 nor Vr_3 falls within the range VM, a normal estimation is that the difference between the ON-cell count CC_1 and the expected value EC, or the difference between the ON-cell count CC_3 and the expected value EC is minimum. If the difference between the ON-cell count CC_1 and the expected value EC, or the difference between the ON-cell count CC_3 and the expected value EC is minimum (ST108; No), the memory controller 2 determines the search direction for the minimum point, with use of a method different from that in ST105 (ST109). More specifically, the memory controller 2 determines, as the search direction, a direction from the read voltage VCGR having been used for reading data that involves the ON-cells whose ON-cell count is one of CC_1 and CC_3 which gives a larger difference from the expected value EC, towards the read voltage VCGR having been used for reading data that involves the ON-cells whose ON-cell count is one of CC_1 and CC_3 which gives a smaller difference from the expected value EC. If the difference between the ON-cell count CC_1 and the expected value EC is minimum, the search direction lies in a direction the voltage level decreases (i.e., negative direction of the voltage). Meanwhile, if the difference between the ON-cell count CC_3 and the expected value EC is minimum, the search direction lies in a direction the voltage level increases (i.e., positive direction of the voltage). The flow of FIG. 10 comes to the end upon execution of ST109.

If the difference between the ON-cell count CC_2 and the expected value EC is minimum (ST108; Yes), the memory controller 2 executes ST105. In a case where neither the read voltage Vr_2 nor Vr_3 falls within the range VM, a normal estimation is that the difference between the ON-cell count CC_2 and the expected value EC will not be minimum. Thus minimized difference between the ON-cell count CC_2 and the expected value EC is therefore considered to be attributable to any unintended event (error) occurred in the steps so far. Based on this indication, the search direction is determined by ST105, rather than ST109.

1.2.3.1.1. Expected Value

FIG. 13 illustrates an example of expected values EC used in the memory system of the first embodiment. When the memory controller 2 determines to write data in the semiconductor memory 1, the memory controller 2 divides the data to be written into the size of pages, and write the data by page to the semiconductor memory 1. The memory controller 2 in this process randomizes the page data to be written. Randomization means random and reversible shuffling of bits in the page data. As a result of the randomization, local maldistribution of the "0" data and the "1" data in the page size data may be reduced, thus making the "0" data and the "1" data distributed in a substantially uniform manner. Since the "0" data and the "1" data of the page data written to the individual pages distribute in a substantially uniform manner, so that also the states of the memory cell transistors MT in the cell units CU, having the data written to all of four pages, will distribute in a substantially uniform manner. That is, the number of the memory cell transistors MT assigned to the individual states in such cell unit CU will be substantially equal.

Referring now to the present case where one cell unit CU contains m memory cell transistors MT, the number of memory cell transistors MT in each state is given by $CS=m/2^L$. L represents the number of pages stored in the cell unit CU. Referring now to the present case where one cell unit CU contains 4-page data, L represents 4.

Since the numbers of memory cell transistors MT assigned to the individual states in such cell unit CU are substantially same, so that the total number of memory cell transistors MT in a certain state and in the lower state is proportional to CS, based on the position of the state. More specifically, as illustrated in FIG. 13, the cumulative numbers of transistors up to the "0", "1", "2", "3", "4", "5", "6", "7", "8", "9", "10", "11", "12", "13", and "14" states are given by CS, 2CS, 3CS, 4CS, 5CS, 6CS, 7CS, 8CS, 9CS, 10CS, 11CS, 12CS, 13CS, 14CS, and 15CS, respectively. These numbers are used as the expected value EC. Assuming that P represents a positive integer, and referring to a case where the target local minimum point is given by a local minimum point between the Pth state and the (P+1)th state from the bottom, the expected value EC for estimating the target local minimum point is given by CS×P. Referring to an exemplary local minimum value between the "3" and "4" states, the expected value EC for estimating the target local minimum is given by 4CS.

1.2.3.2. Estimation of Local Minimum Point

The local minimum point may be estimated by any of known methods, as long as the search starts in the search direction determined in ST1. Two Examples will be outlined below.

1.2.3.2.1. First Example

Figure 14:
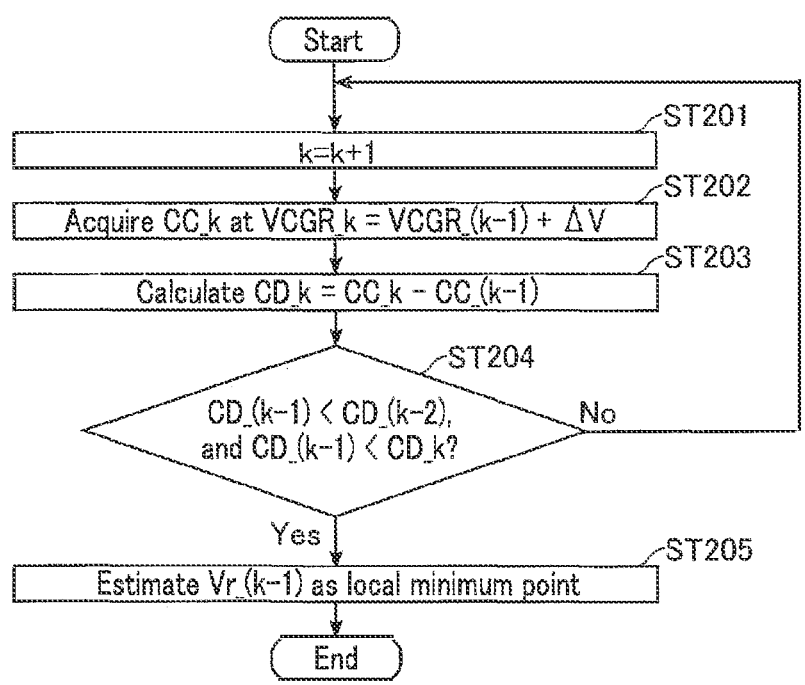
FIG. 14 illustrates a flow of local minimum search executed by the memory controller of the memory system of the first embodiment.
Figure 15:
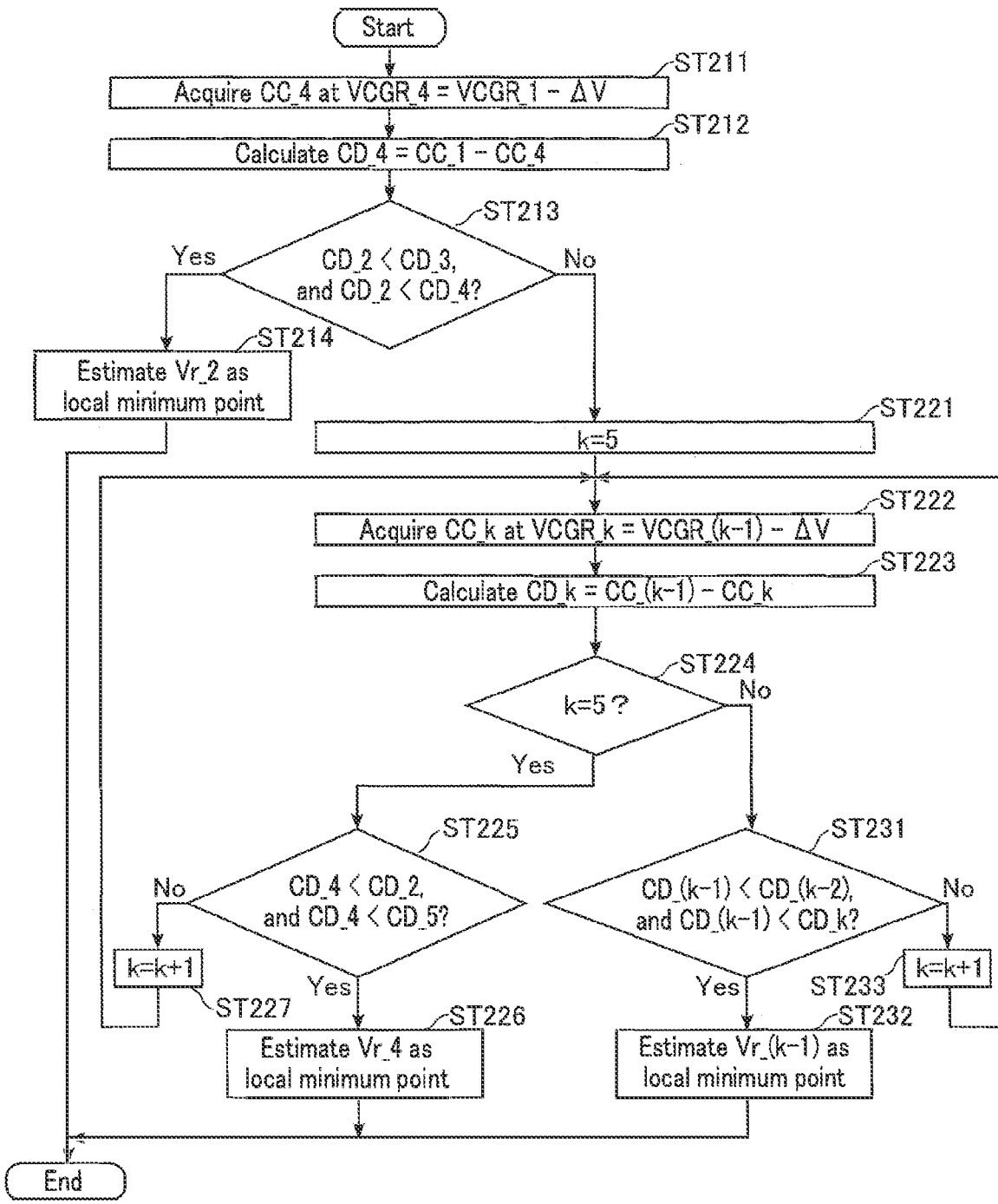
FIG. 15 illustrates a flow of local minimum search executed by the memory controller of the memory system of the first embodiment.

FIGS. 14 and 15 illustrate flows of operations executed by the memory controller of the memory system of the first embodiment. More specifically, FIGS. 14 and 15 illustrate sub-flows of the first example of estimation of local minimum point (ST2) illustrated in FIG. 9. FIG. 14 illustrates a case where the search direction is determined as positive in ST1 of FIG. 10. FIG. 15 illustrates a case where the search direction is determined as negative in ST1 of FIG. 10. The memory controller 2, particularly the CPU 24, executes the operations described below with reference to FIGS. 14 and 15.

The memory controller 2 compares three ON-cell count differences CD, which are derived from total four On-cell counts including the ON-cell count CC_k and three ON-cell counts CC obtained with use of three levels of the read voltage VCGR closest to the read voltage VCGR_k, and determines which of the three ON-cell count differences CD gives the local minimum point.

As illustrated in FIG. 14, the memory controller 2 increments variable k by 1 (ST201).

The memory controller 2 executes the shift read with use of the read voltage VCGR_k, to acquire the ON-cell count CC_k (ST202). The read voltage VCGR_k is higher than the read voltage VCGR_k−1, by the shift voltage ΔV. Detail of acquisition of the ON-cell count CC_k is same as described with respect to ST101 in FIG. 10. The shift read uses the single state read.

The memory controller 2 calculates the ON-cell count difference CD_k (ST203). The ON-cell count difference CD_k is given by ON-cell count CC_k minus ON-cell count CC_k−1. Detail of calculation of the ON-cell count difference CD_k is same as described with respect to ST102 in FIG. 10.

Three ON-cell count differences CD, which are derived from the ON-cell count CC_k, and three ON-cell counts CC obtained with use of the three levels of the read voltage VCGR closest to the read voltage VCGR_k, are given by ON-cell count differences CD_k−2, CD_k−1, and CD_k. Based on this relationship, the memory controller 2 determines whether ON-cell count difference CD_k−1<ON-cell count difference CD_k−2, and, ON-cell count difference CD_k−1<ON-cell count difference CD_k hold (ST204).

If ON-cell count difference CD_k−1<ON-cell count difference CD_k−2, and, ON-cell count difference CD_k−1<ON-cell count difference CD_k hold (ST204; Yes), the memory controller 2 estimates that the read voltage Vr_(k−1) represents the local minimum point (ST205). The flow of FIG. 14 comes to the end upon execution of ST205.

On the other hand, if ON-cell count difference CD_k−1<ON-cell count difference CD_k−2, and, ON-cell count difference CD_k−1<ON-cell count difference CD_k do not hold (ST204; No), the flow continues to ST201.

As illustrated in FIG. 15, the memory controller 2 sets the variable k to 4 (ST211).

The memory controller 2 executes the shift read with use of the read voltage VCGR_4, to acquire ON-cell count CC_4 (ST211). Since the search direction is negative, the read voltage VCGR_4 is lower than VCGR_1, which is the lowest VCGR from among the read voltages VCGR_1, VCGR_2, and VCGR_3 used so far. The read voltage VCGR_4 is lower than the read voltage VCGR_1, by the shift voltage ΔV. Detail of acquisition of the ON-cell count CC_k is same as described with respect to ST101 in FIG. 10. The shift read uses the single state read.

The memory controller 2 calculates the ON-cell count difference CD_4 (ST212). The ON-cell count difference CD_4 is a difference between the ON-cell count CC_4, and the ON-cell count CC that corresponds to the smallest read voltage VCGR from among the ON-cell count CC_1, CC_2, and CC_3 acquired so far, that is, the ON-cell count CC_1. That is, the ON-cell count difference CD_4 is given by ON-cell count CC_1 minus ON-cell count CC_4.

Three ON-cell count differences CD, which are derived from the ON-cell count CC_4, and three ON-cell counts CC obtained with use of three levels of the read voltage VCGR closest to the read voltage VCGR_4, are given by ON-cell count differences CD_2, CD_3, and CD_4. Based on this relationship, the memory controller 2 determines whether ON-cell count difference CD_2<ON-cell count difference CD_3, and, ON-cell count difference CD_2<ON-cell count difference CD_4 (ST213).

If ON-cell count difference CD_2<ON-cell count difference CD_3 and ON-cell count difference CD_2<ON-cell count difference CD_4 hold (ST213; Yes) hold, the memory controller 2 estimates that the read voltage Vr_2 represents the local minimum point (ST214). The flow of FIG. 14 comes to the end upon execution of ST214.

On the other hand, if ON-cell count difference CD_2<ON-cell count difference CD_3 and ON-cell count difference CD_2<ON-cell count difference CD_4 do not hold (ST213; No), the memory controller 2 sets the variable k to 5 (ST221).

The memory controller 2 executes the shift read with use of the read voltage VCGR_k, to acquire the ON-cell count CC_k (ST222). The read voltage VCGR_k is lower than the read voltage VCGR_k−1, by the shift voltage ΔV. Detail of acquisition of the ON-cell count CC_k is same as described with respect to ST101 in FIG. 10. The shift read uses the single state read.

The memory controller 2 calculates the ON-cell count difference CD_k (ST223). The ON-cell count difference CD_k is given by ON-cell count CC_k−1 minus ON-cell count CC_k.

The memory controller 2 determines that k represents 5 or not (ST224). If k represents 5 (ST224; Yes), three ON-cell count differences CD, which are derived from the ON-cell count CC_5, and three ON-cell counts CC obtained with use of three levels of the read voltage VCGR closest to the read voltage VCGR_5 are given by ON-cell count differences CD_2, CD_4, and CD_5. Based on this relationship, the memory controller 2 determines whether ON-cell count difference CD_4<ON-cell count difference CD_2, and, ON-cell count difference CD_4<ON-cell count difference CD_5 (ST225).

If ON-cell count difference CD_4<ON-cell count difference CD_2, and, ON-cell count difference CD_4<ON-cell count difference CD_5 hold (ST225; Yes), the memory controller 2 estimates that the read voltage Vr_4 represents the local minimum point (ST226). The flow of FIG. 14 comes to the end upon execution of ST226.

If ON-cell count difference CD_4<ON-cell count difference CD_2, and, ON-cell count difference CD_4<ON-cell count difference CD_5 do not hold (ST225; No), the memory controller 2 increments k by 1 (ST227). ST227 continues to ST222.

If k does not represent 5 (ST224; No), three ON-cell count differences CD, which are derived from the ON-cell count CC_k, and three ON-cell counts CC obtained with use of three levels of the read voltage VCGR closest to the read voltage VCGR_k, are given by ON-cell count differences CD_k–2, CD_k–1, and CD_k. Based on this relationship, the memory controller 2 determines whether ON-cell count difference CD_k–1<ON-cell count difference CD_k–2, and, ON-cell count difference CD_k–1<ON-cell count difference CD_k hold (ST231).

If ON-cell count difference CD_k–1<ON-cell count difference CD_k–2, and, ON-cell count difference CD_k–1<ON-cell count difference CD_k hold (ST231; Yes), the memory controller 2 estimates that the read voltage Vr_k–1 represents the local minimum point (ST232). The flow of FIG. 14 comes to the end upon execution of ST232.

If ON-cell count difference CD_k–1<ON-cell count difference CD_k–2, and, ON-cell count difference CD_k–1<ON-cell count difference CD_k do not hold (ST231; No), the memory controller 2 increments k by 1 (ST233). ST233 continues to ST222.

1.2.3.2.2. Second Example

In the second example, the memory controller 2 determines a search range that is estimated to contain the target local minimum point, prior to ST1. The determination may rely upon any method. For example, the determination may rely upon preliminary statistical processing and/or simulation.

As ST2, the memory controller 2 repeats the shift read in the search direction having been determined in ST1, over the determined search range. The memory controller 2 estimates the minimum read voltage Vr from among all ON-cell count differences CD obtainable by the repeated shift read, that is, from among all read voltages Vr, as the local minimum point. The search for the minimum point can rely upon the flow of FIG. 14 if the search direction is positive, meanwhile can rely upon the flow of FIG. 15 if the search direction is negative.

1.2.3.3. Instance of Local Minimum Search

Figure 16:
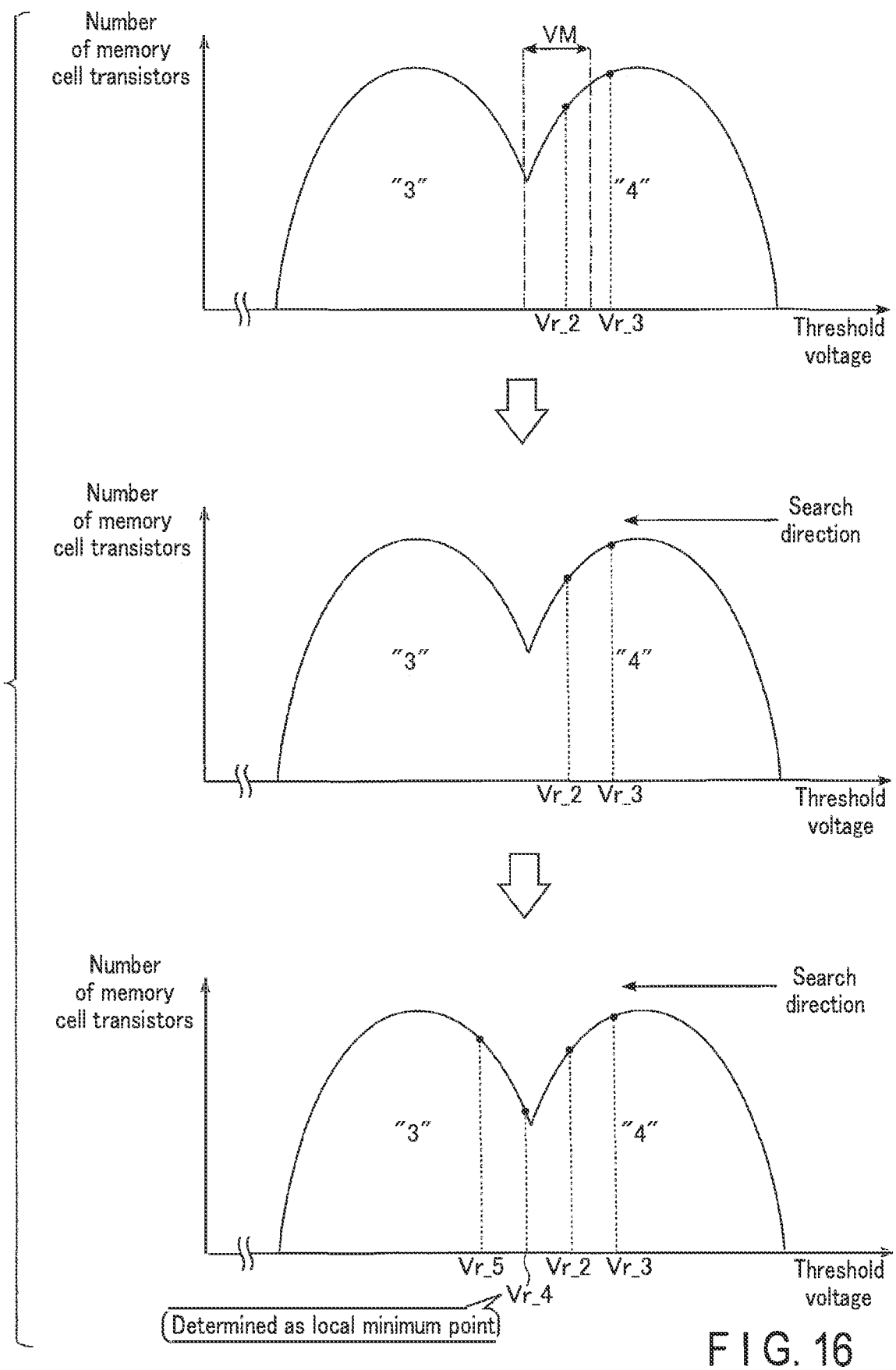
FIG. 16 illustrates a first instance of local minimum search in the memory system of the first embodiment.

FIG. 16 illustrates a first instance of local minimum search in the memory system 5 of the first embodiment. FIG. 16 illustrates a first case where Yes was determined at ST104 in the sub-flow of FIG. 10. In the example of FIG. 16, the read voltage Vr_2 falls in the range VM, as illustrated in the top tier. Since the read voltage Vr_2 is lower than the read voltage Vr_3, the search direction is determined to the negative direction of the threshold voltage, as illustrated in the middle tier.

The read voltages Vr are sequentially acquired in the negative direction, thus resulting in sequential acquisition of the read voltages Vr_4 and Vr_5. The read voltage Vr_4 is lower than the read voltages Vr_2 and Vr_5. The read voltage Vr_4 is therefore estimated to represent the local minimum point. The estimated minimum point falls between the "3" state and the "4" state, similarly to the target local minimum point. That is, the estimated minimum point is a minimum point that can be used as a read voltage for distinguishing between the "3" state and the "4" state, similarly to the target local minimum point.

Figure 17:
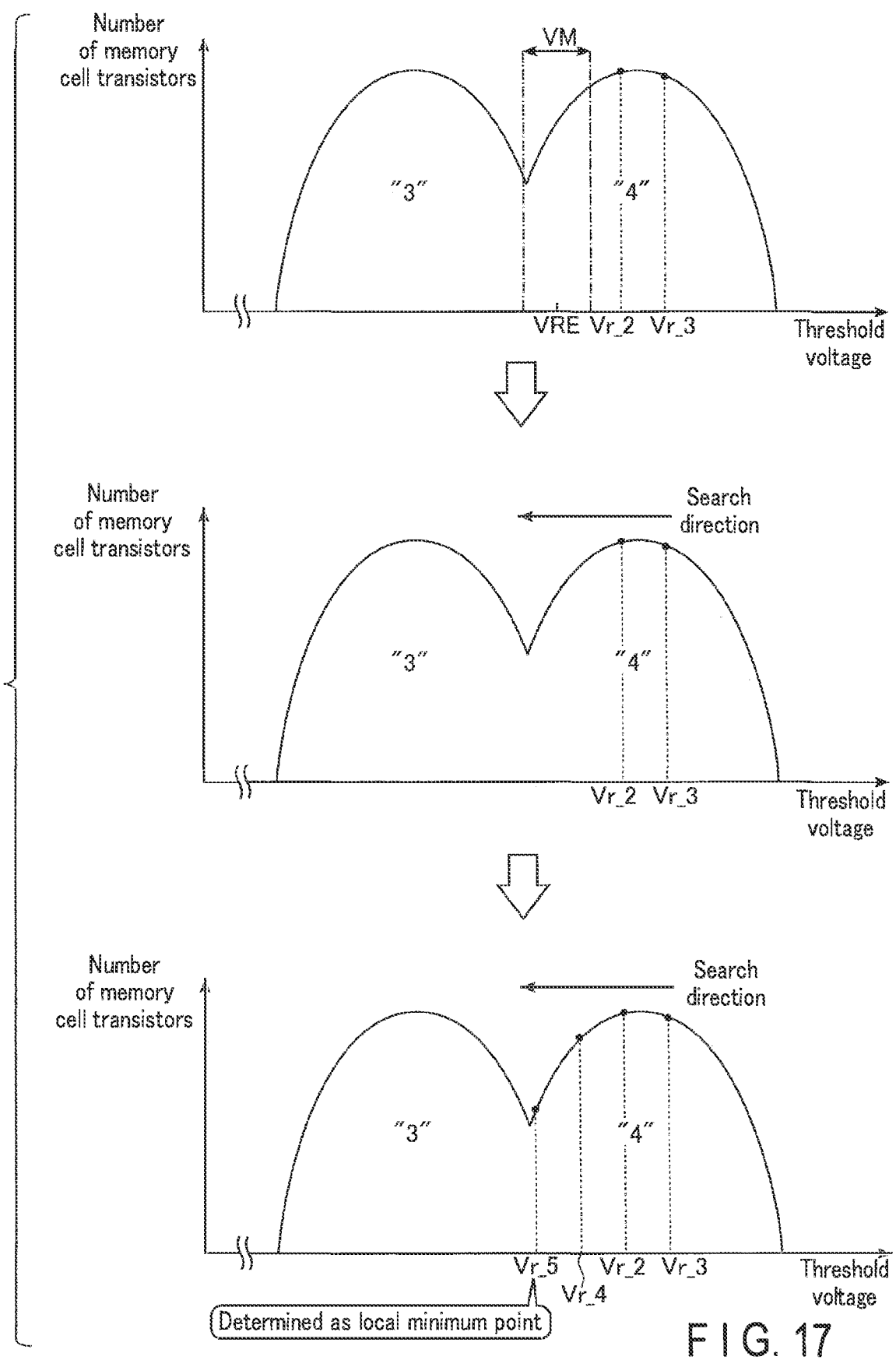
FIG. 17 illustrates a second instance of local minimum search in the memory system of the first embodiment.

FIG. 17 illustrates a second instance of local minimum search in the memory system 5 of the first embodiment. FIG. 17 illustrates a second case where No was determined both at ST104 and ST108 in the sub-flow of FIG. 10. In the example of FIG. 17, neither the read voltage Vr_2 nor Vr_3 falls in the range VM, as illustrated in the top tier. Hence, one of the ON-cell counts CC_1, CC_2, and CC_3, whichever minimizes the difference from the expected value EC (=4CS), is selected. In the example of FIG. 17, the ON-cell count CC_1 is selected. The search direction is therefore determined to be the negative direction of the voltage.

The read voltages Vr are sequentially acquired in the negative direction, thus resulting in sequential acquisition of the read voltages Vr_4 and Vr_5. The read voltage Vr_5 is lower than the read voltages Vr_2 and Vr_4. Hence, similarly to the case of FIG. 16, the read voltage Vr_5 is estimated to be the local minimum point that can be used for distinguishing between the "3" state and the "4" state, like the target local minimum point.

1.3. Advantages (Advantageous Effects)

The first embodiment can provide a memory system by which erroneous estimation of the local minimum point is suppressed, as described below.

A memory system 100, which is not illustrated, will be described for comparison and reference. The memory system 100 has the same components and couplings as those of the memory system 5, but operates differently from the memory system 5. The memory system 100 executes steps ST101, ST102, and ST103 in FIG. 10 according to the first embodiment, to search for the target local minimum point. The memory system 100 then executes step ST105. The search towards the thus determined search direction may yield the results illustrated in FIG. 18.

Figure 18:
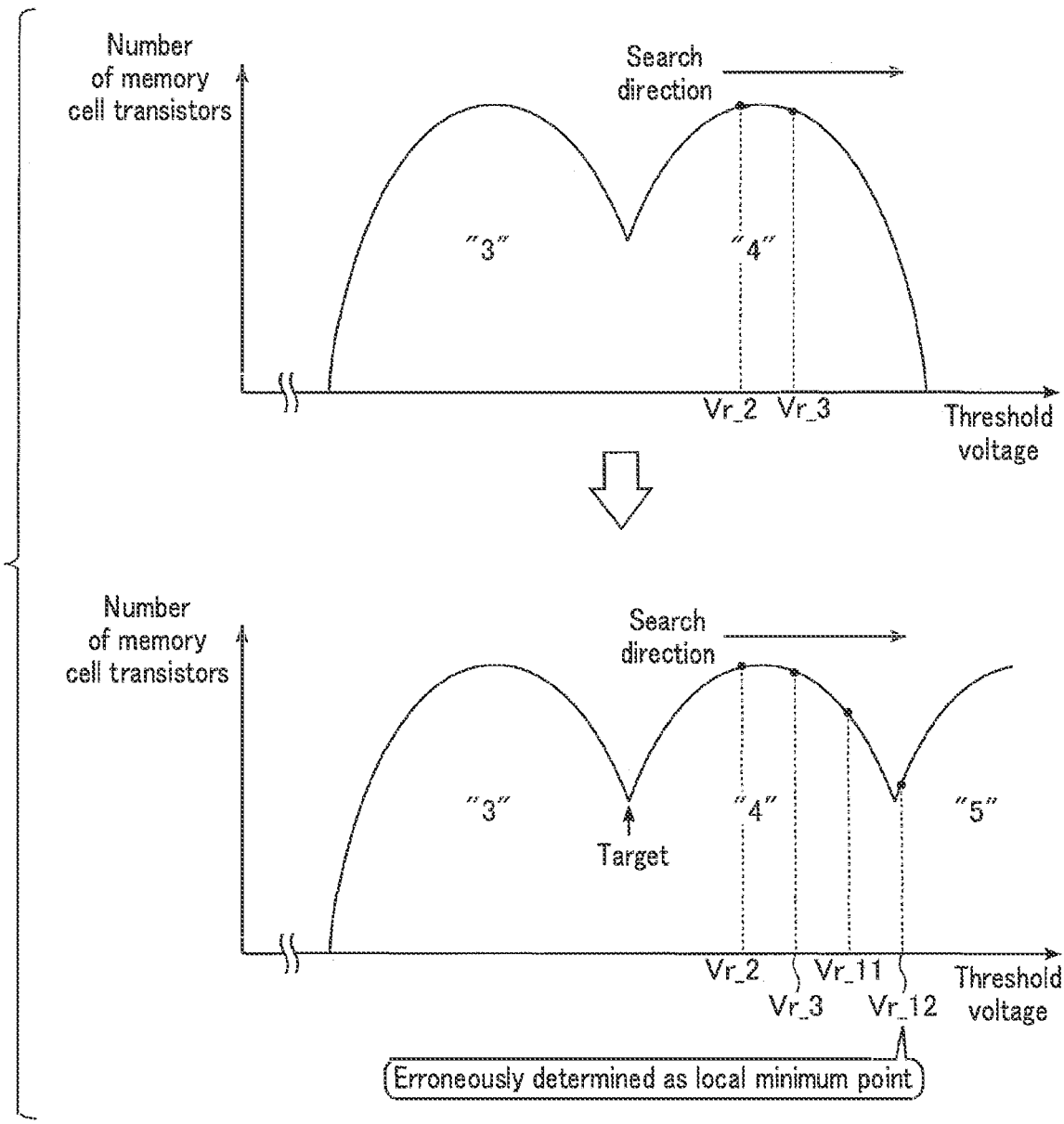
FIG. 18 illustrates local minimum search in a reference memory system.

The top tier of FIG. 18 is same as the top tier of FIG. 17 of the first embodiment, illustrating that the read voltages Vr_2 and Vr_3 having the same levels as those in the first embodiment have already been acquired. Since the read voltage Vr_3 is lower than the read voltage Vr_2, the search direction is determined to the positive direction of the voltage. The read voltage Vr is sequentially acquired in the thus determined search direction, thus resulting in sequential acquisition of the read voltages Vr_11 and Vr_12. As a result of such acquisition of the read voltages Vr, the read voltage Vr_12 is determined as the local minimum point. The read voltage Vr_12, however, resides between the "4" state and the "5" state, unlike the target local minimum point that resides between the "3" state and the "4" state. That is, the thus determined read voltage Vr_12 does not represent required read voltage for distinguishing the states. Use of the read voltage Vr_12 would lead to erroneous data read. The erroneous determination as illustrated in FIG. 18 may occur in a case where the initial two read voltages Vr_2 and Vr_3 reside far away from the target local minimum point. In particular, this would be more likely to occur, if the initial two read voltages Vr_2 and Vr_3 reside near the local maximum point of the threshold voltage lobe.

According to the first embodiment, the direction from a larger one of the read voltages Vr_2 and Vr_3 towards a smaller one of the read voltages Vr_2 and Vr_3, is determined as the search direction, if at least either of the initial two read voltages Vr_2 or Vr_3 falls within the range VM (first case). As long as at least either the read voltage Vr_2 or Vr_3 falls within the range VM, the read voltages Vr_2 and Vr_3 may be estimated to reside near the read voltage between the two states that are distinguished by the local minimum point to be searched, and therefore reside near the read voltage that corresponds to the target local minimum point. Hence, use of the search direction from a larger one of the read voltages Vr_2 and Vr_3 toward a smaller one of the read voltages Vr_2 and Vr_3, is suppressed from determining a local minimum point that distinguishes any states different from two states to be distinguished by the target local minimum point, instead making it more likely to estimate the target local minimum point. This makes it possible to estimate the target local minimum point within a short time with high accuracy. Use of the target local minimum point for distinguishing the states enables data read with high accuracy.

According to the first embodiment, if none of the initial two read voltages Vr_2 and Vr_3 fall within the range VM, any one of the ON-cell count CC_1, CC_2, or CC_3, that gives the smallest difference from the expected value EC, is selected. Moreover, unless otherwise the ON-cell count CC_2 is selected (second case), the search direction is determined by the direction from the read voltage VCGR having been used for reading data that involves the ON-cells whose ON-cell count gives larger difference from the expected value EC, towards the read voltage VCGR having been used for reading data that involves the ON-cells whose ON-cell count CC gives smaller difference from the expected value EC. The thus determined search direction is more likely to aim for the target local minimum point. Hence, even in a case where none of the initial two read voltages Vr_2 and Vr_3 falls within the range VM, it is possible to suppress determination of a local minimum point that distinguishes any states different from two states to be distinguished by the target local minimum point. This enables determination of the target local minimum point with higher accuracy, and the data read with higher accuracy.

2. Second Embodiment

The second embodiment is different from the first embodiment, in details of determination of the search direction based on the initial search for the target local minimum point (i.e., step ST1 in FIG. 9).

A memory system 5b of the second embodiment has the same structure as the structure of the memory system 5 of the first embodiment. A memory controller 2b of the second embodiment is, however, configured to enable execution of operations described below. More specifically, a program in a ROM 22b is configured to make the memory controller 2b operate as described below, upon being executed by a CPU 24.

Figure 19:
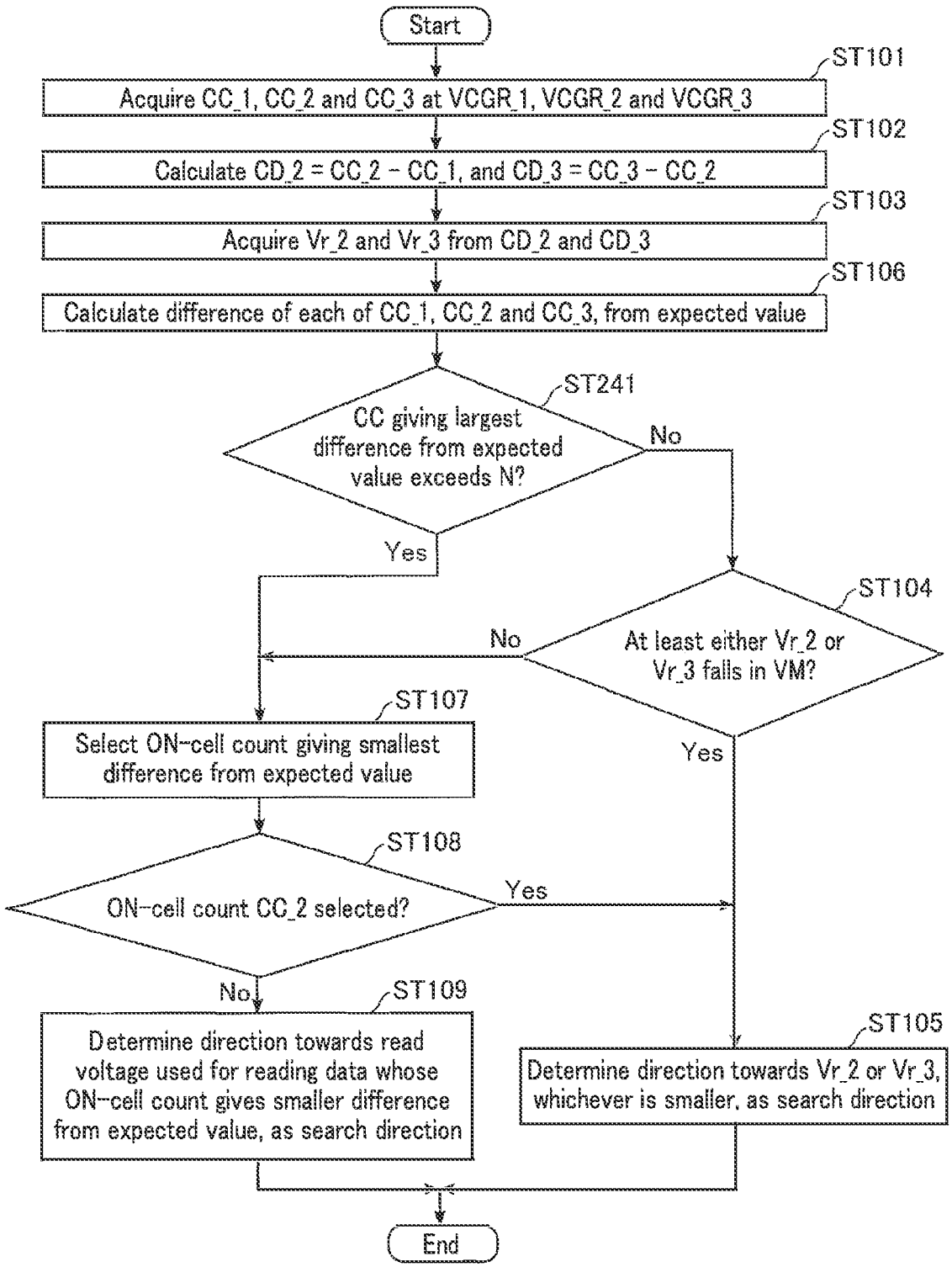
FIG. 19 illustrates a flow of an operation by a memory controller of a memory system of a second embodiment.

FIG. 19 illustrates a flow of an operation executed by the memory controller of the memory system of the second embodiment. More specifically, FIG. 19 illustrates a sub-flow of the initial search and determination of search direction (ST1) illustrated in FIG. 9. The memory controller 2b, particularly the CPU 24, executes the operations described below with reference to FIG. 19.

The memory controller 2b executes ST106, after ST103. After ST106, the memory controller 2b determines whether one of the ON-cell counts CC_1, CC_2, and CC_3 which gives the largest difference from the expected value EC exceeds a threshold value N (ST241).

ST241 is executed in order to detect that the read voltages Vr_2 and Vr_3, which are acquired based on the ON-cell counts CC_1, CC_2, and CC_3, reside far distant from the target local minimum point. Based on this purpose, ST241 is typically executed to detect that the read voltages Vr_2 and Vr_3 reside in the vicinity of any local minimum point between two states that are different from the two states to be distinguished by the target local minimum point. For this purpose, the threshold value N may typically be set to CS ($=m/2^L$).

If the ON-cell count CC that gives the largest difference from the expected value does not exceed the threshold value N (ST241; No), the flow continues to ST104. If the determination at ST104 is Yes, the flow continues to ST105, and the flow of FIG. 19 comes to the end upon execution of ST105.

In a case where the ON-cell count CC that gives the largest difference from the expected value EC exceeds the threshold value N (ST241; Yes) or if the determination at ST104 is No, the search direction is determined with use of the ON-cell count CC that gives the smallest difference from the expected value EC as in the first embodiment. That is, if the ON-cell count CC that gives the largest difference from the expected value exceeds the threshold value N (ST241; Yes) or if the determination at ST104 is No, ST107 is executed, since ST106 has already been executed. ST107 continues to ST108. If the determination at ST108 is No, ST109 is executed, and the flow of FIG. 19 comes to the end upon execution of ST109. On the other hand, if the determination at ST108 is Yes, ST105 is executed.

According to the second embodiment, whether one of the ON-cell counts CC_1, CC_2, and CC_3 which gives the largest difference from the expected value EC exceeds the threshold value N or not is determined. If the ON-cell count CC that gives the largest difference exceeds the threshold value N, the read voltages Vr_2 and Vr_3 are estimated to be largely distant from the target local minimum point. Based on this estimation, and following the same steps as in the first embodiment, the search direction is determined based on whether or not the read voltage Vr_2 or Vr_3 falls within the range VM, and/or based on the ON-cell count CC that gives the smallest difference from the expected value EC. According to the second embodiment, it is possible to obtain advantages same as those of the first embodiment by the steps same as those of the first embodiment; and to additionally determine the target local minimum point with higher accuracy than in the first embodiment, by comparing the ON-cell count CC that gives the largest difference from the expected value EC, with the threshold value N, prior to the steps same as those in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A memory system comprising:
a semiconductor memory; and
a memory controller configured
to receive, from the semiconductor memory, first data obtained by a first read, the first read specifying a first read voltage and a first address, to receive, from the semiconductor memory, second data obtained by a second read, the second read specifying a second read voltage higher than the first read voltage and the first address, to receive, from the semiconductor memory, third data obtained by a third read, the third read specifying a third read voltage higher than the second read voltage and the first address, to instruct the semiconductor memory to execute a fourth read specifying a fourth read voltage lower than the first read voltage and the first address, when a first difference between a first number of bits of a first value in the first data and an expected value is smaller than a second difference between a second number of bits of the first value in the third data and the expected value, and to instruct the semiconductor memory to execute a fifth read specifying a fifth read voltage higher than the third read voltage and the first address, when the first difference is larger than the second difference.

2. The memory system according to claim 1, wherein the memory controller is further configured to instruct the semiconductor memory to execute the fourth read or the fifth read, when neither a first voltage between the first read voltage and the second read voltage nor a second voltage between the second read voltage and the third read voltage falls within a first range.

3. The memory system according to claim 2, wherein the memory controller is further configured to instruct the semiconductor memory to execute the fourth read or the fifth read, when neither the first voltage nor the second voltage falls within the first range and a third difference between a third number of bits of the first value in the second data and the expected value is not lower than both of the first difference and the second difference.

4. The memory system according to claim 3, wherein the memory controller is further configured to instruct the semiconductor memory to execute a sixth read specifying a sixth read voltage lower than a smaller one of the first voltage and the second voltage and the first address, when either the first voltage or the second voltage falls within the first range.

5. The memory system according to claim 4, wherein the memory controller is further configured to instruct the semiconductor memory to execute the sixth read, when neither the first voltage or the second voltage falls within the first range and the third difference is lower than the first difference and the second difference.

6. The memory system according to claim 1, wherein the semiconductor memory includes m memory cell transistors with m defined as an integer of 2 or larger, and the expected value is a number which is P times $m/2^L$, with L defined as an integer of 2 or larger and with P defined as an integer of 1 or larger.

7. The memory system according to claim 6, wherein each of the m memory cell transistors stores L-bit data, the m memory cell transistors, immediately after writing of data into the m memory cell transistors, demonstrates a threshold voltage distribution having $2^L$ independent lobes, and P is used for estimation of a read voltage used for distinguishing which one of the P-th lobe and the (P+1)-th lobe toward a higher threshold voltage out of the $2^L$ lobes contain respective threshold voltages of the m memory cell transistors.

8. The memory system according to claim 1, wherein each of the first read, the second read, the third read, the fourth read, and the fifth read instructs a data read which is based on whether or not a threshold voltage of a memory cell transistor specified by the first address is lower than the first read voltage, the second read voltage, the third read voltage, the fourth read voltage, and the fifth read voltage, respectively.

9. The memory system according to claim 1, wherein the memory controller is further configured to instruct the semiconductor memory to execute a sixth read specifying the first address and a sixth read voltage which is smaller than a smaller one of a first voltage and a second voltage, the first voltage being between the first read voltage and the second read voltage, and the second voltage being between the second read voltage and the third read voltage, when a largest one of the first difference, the second difference, and a third difference between a third number of bits of the first value in the second data and the expected value does not exceed a first threshold.

10. The memory system according to claim 9, wherein the memory controller is further configured to instruct the semiconductor memory to execute the fourth read or the fifth read, when the largest one of the first difference, the second difference, and the third difference does not exceed the first threshold and neither a first voltage between the first read voltage and the second read voltage nor a second voltage between the second read voltage and the third read voltage falls within a first range.

11. The memory system according to claim 10, wherein the memory controller is further configured to instruct the semiconductor memory to execute the fourth read or the fifth read, when the largest one of the first difference, the second difference, and the third difference does not exceed the first threshold, neither the first voltage or the second voltage falls within the first range, and the third difference is not lower than both of the first difference and the second difference.

12. The memory system according to claim 11, wherein the memory controller is further configured to instruct the semiconductor memory to execute the sixth read, when the largest one of the first difference, the second difference, and the third difference does not exceed the first threshold and either the first voltage or the second voltage falls within the first range.

13. The memory system according to claim 12, wherein the memory controller is further configured to instruct the semiconductor memory to execute the sixth read, when the largest one of the first difference, the second difference, and the third difference does not exceed the first threshold, neither the first voltage nor the second voltage falls within the first range, and the third difference is lower than the first difference and the second difference.

14. The memory system according to claim 9, wherein the memory controller is further configured to instruct the semiconductor memory to execute the fourth read or the fifth read, when a largest one of the first difference, the second difference, and a third difference between a third number of bits of the first value in the second data and the expected value exceeds the first threshold value.

15. The memory system according to claim 14, wherein the memory controller is further configured to instruct the semiconductor memory to execute the fourth read or the fifth read, when the largest one of the first difference, the second difference, and the third difference exceeds the first threshold value and the third difference is not lower than both of the first difference and the second difference.

16. The memory system according to claim 14, wherein the memory controller is further configured to instruct the semiconductor memory to execute the sixth read, when the largest one of the first difference, the second difference, and the third difference exceeds the first threshold value and the third difference is lower than the first difference and the second difference.

17. The memory system according to claim 9, wherein the semiconductor memory includes m memory cell transistors with m defined as an integer of 2 or larger, and the expected value is a number which is P times $m/2^L$, with L defined as an integer of 2 or larger and with P defined as an integer of 1 or larger.

18. The memory system according to claim 17, wherein each of the m memory cell transistors stores L-bit data, the m memory cell transistors, immediately after writing of data into the m memory cell transistors, demonstrates a threshold voltage distribution having $2^L$ independent lobes, and P is used for estimation of a read voltage used for distinguishing which one of the P-th lobe and the (P+1)-th lobe toward a higher threshold voltage out of the $2^L$ lobes contain respective threshold voltages of the m memory cell transistors.

19. The memory system according to claim 9, wherein each of the first read, the second read, the third read, the fourth read, and the fifth read instructs a data read which is based on whether or not a threshold voltage of a memory cell transistor specified by the first address is lower than the first read voltage, the second read voltage, the third read voltage, the fourth read voltage, and the fifth read voltage, respectively.

20. A method for controlling a semiconductor memory comprising:
  causing the semiconductor memory to transmit first data obtained by a first read, the first read specifying a first read voltage and a first address,
  causing the semiconductor memory to transmit second data obtained by a second read, the second read specifying a second read voltage higher than the first read voltage and the first address,
  causing the semiconductor memory to transmit third data obtained by a third read, the third read specifying a third read voltage higher than the second read voltage and the first address,
  instructing the semiconductor memory to execute a fourth read specifying a fourth read voltage lower than the first read voltage and the first address, when a first difference between a first number of bits of a first value in the first data and an expected value is smaller than a second difference between a second number of bits of the first value in the third data and the expected value, and
  instructing the semiconductor memory to execute a fifth read specifying a fifth read voltage higher than the third read voltage and the first address, when the first difference is larger than the second difference.

* * * * *